(12) United States Patent
Valine

(10) Patent No.: US 7,003,750 B2
(45) Date of Patent: Feb. 21, 2006

(54) TOPOLOGY BASED WIRE SHIELDING GENERATION

(75) Inventor: Thomas N. Valine, San Jose, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 205 days.

(21) Appl. No.: 10/211,495

(22) Filed: Aug. 1, 2002

(65) Prior Publication Data

US 2004/0025132 A1   Feb. 5, 2004

(51) Int. Cl.
*G06F 17/50* (2006.01)

(52) U.S. Cl. ............... 716/11; 716/2; 716/4; 716/5; 716/10; 716/13

(58) Field of Classification Search .............. 716/1, 716/2, 4–6, 8, 10–13; 703/13, 14; 702/117; 307/147; 174/255
See application file for complete search history.

(56) References Cited

U.S. PATENT DOCUMENTS

| | | | |
|---|---|---|---|
| 5,901,063 A * | 5/1999 | Chang et al. | 716/4 |
| 6,185,722 B1 * | 2/2001 | Darden et al. | 716/5 |
| 6,202,194 B1 * | 3/2001 | Seningen et al. | 716/10 |
| 6,385,565 B1 * | 5/2002 | Anderson et al. | 703/18 |
| 6,385,758 B1 * | 5/2002 | Kikuchi et al. | 716/2 |
| 6,480,993 B1 * | 11/2002 | Suto et al. | 716/10 |
| 2002/0040466 A1 * | 4/2002 | Khazei | 716/9 |
| 2003/0172358 A1 * | 9/2003 | Alon et al. | 716/1 |
| 2003/0234583 A1 * | 12/2003 | Valine | 307/147 |
| 2004/0019868 A1 * | 1/2004 | Li | 716/11 |
| 2004/0073880 A1 * | 4/2004 | Yoshida et al. | 716/8 |

* cited by examiner

*Primary Examiner*—Matthew Smith
*Assistant Examiner*—Helen Rossoshek
(74) *Attorney, Agent, or Firm*—Gunnison, McKay & Hodgson, L.L.P.; Lisa A. Norris

(57) ABSTRACT

A topology based approach to shielding wire generation for an integrated circuit design. The present invention generates various templates by sizing one or more signal wire geometries. The various templates are then geometrically added to and/or subtracted from to generate shielding wire patterns. In some embodiments, the templates may be merged to prevent duplicate shielding wire generation between adjacent signal wires that violates design rules. In some embodiments, the topology based approach permits shielding wire generation based upon complex signal wire geometries, such as branched signal wire geometries. The present invention can be implemented in CAD software and in CAD software together with a small amount of custom software to generate design rule clean (DRC) shielding wire generation that utilizes both power and ground nets.

62 Claims, 27 Drawing Sheets

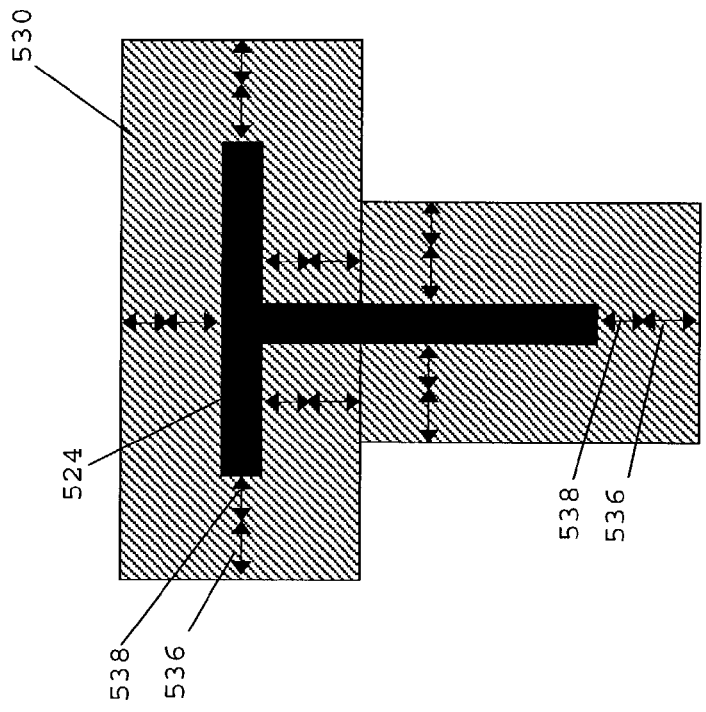
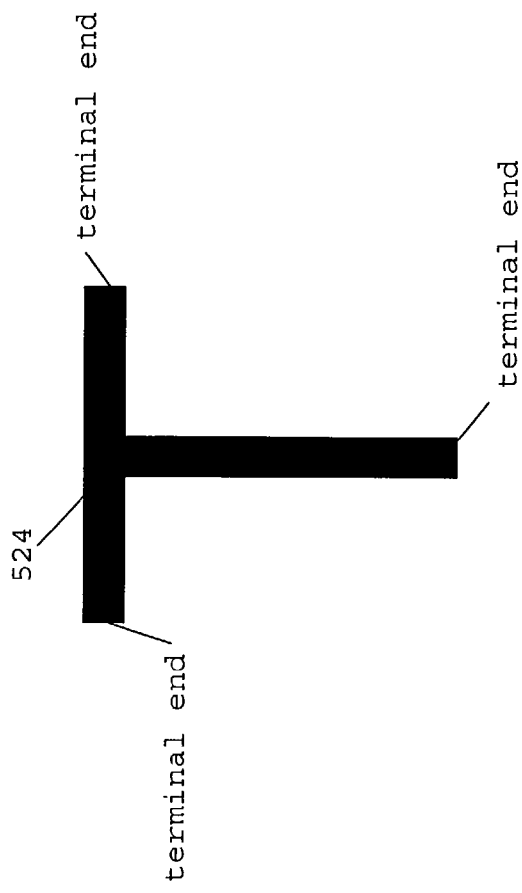
FIG. 5B
FIG. 5A

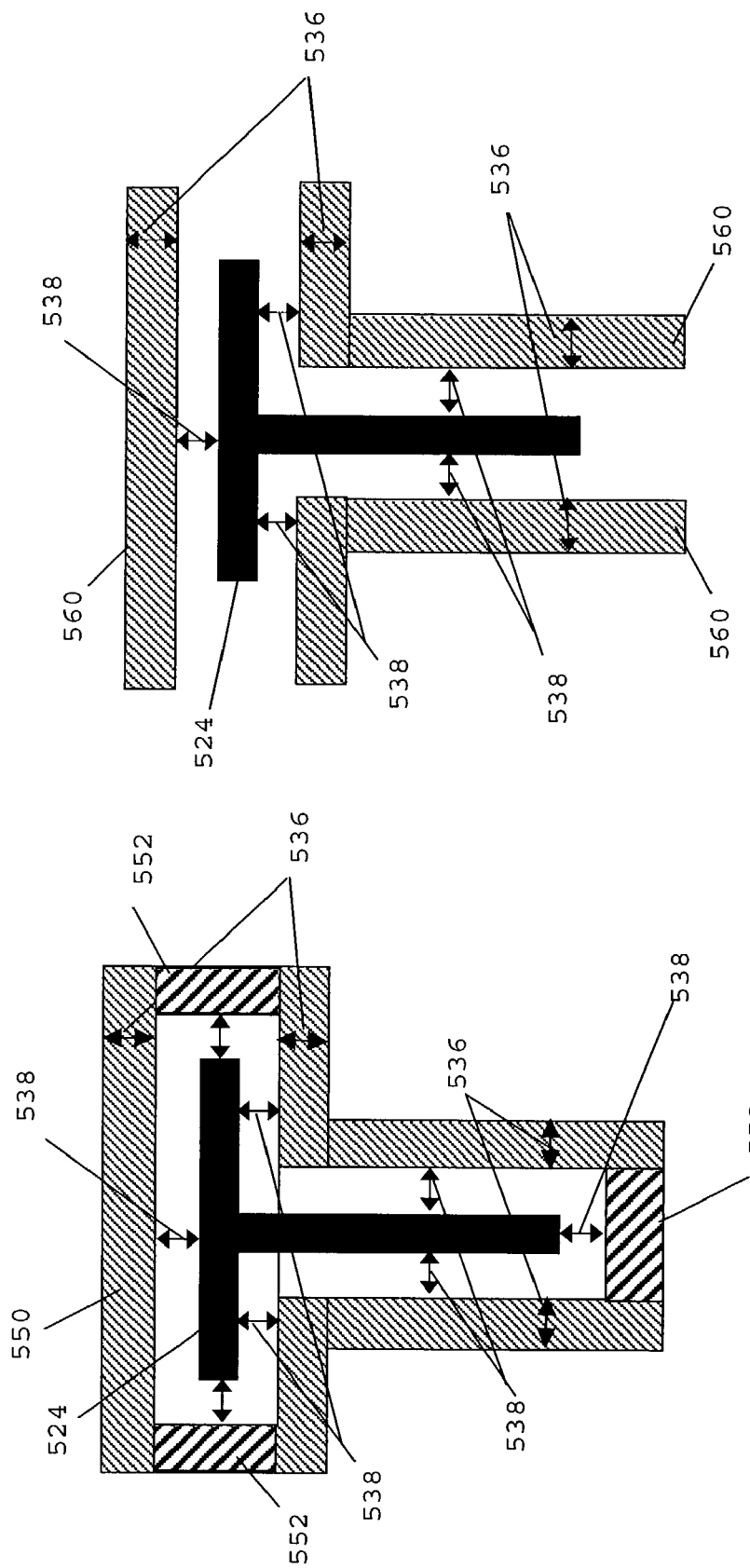

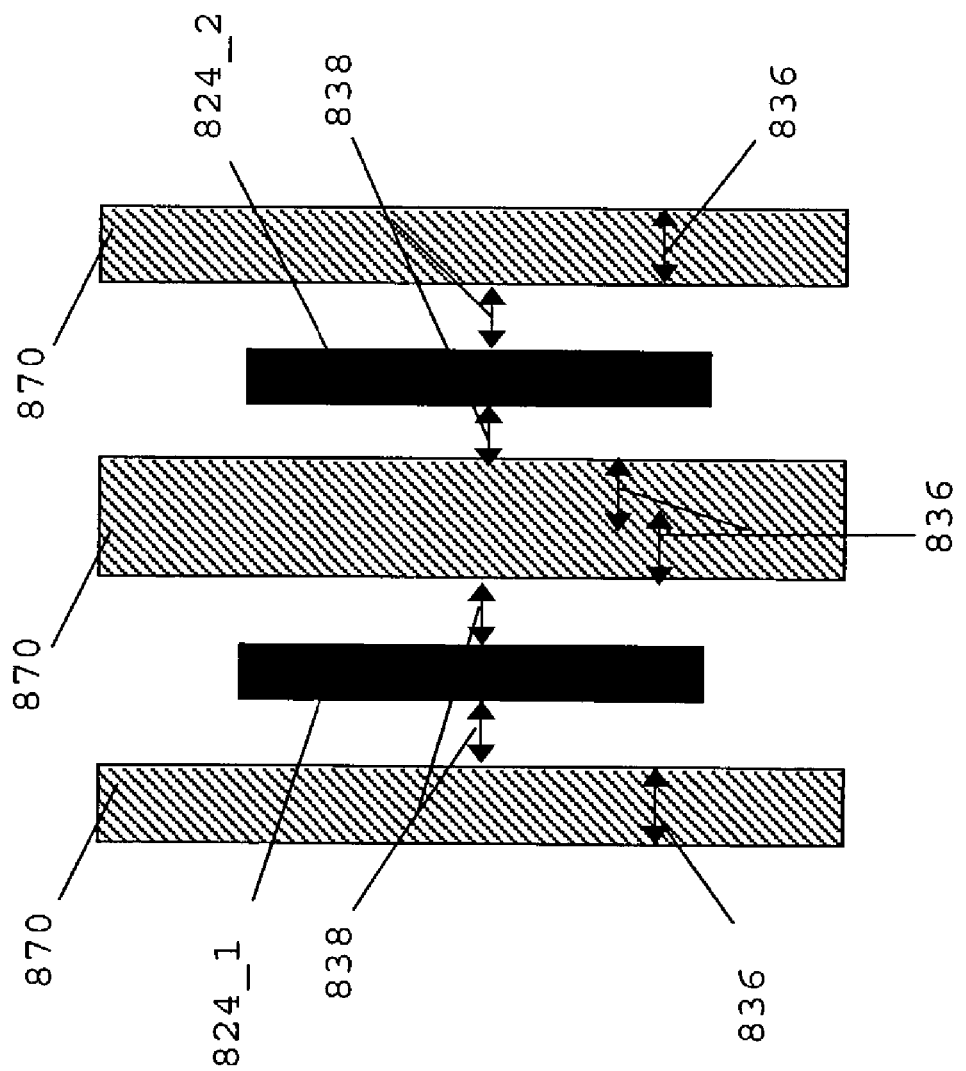

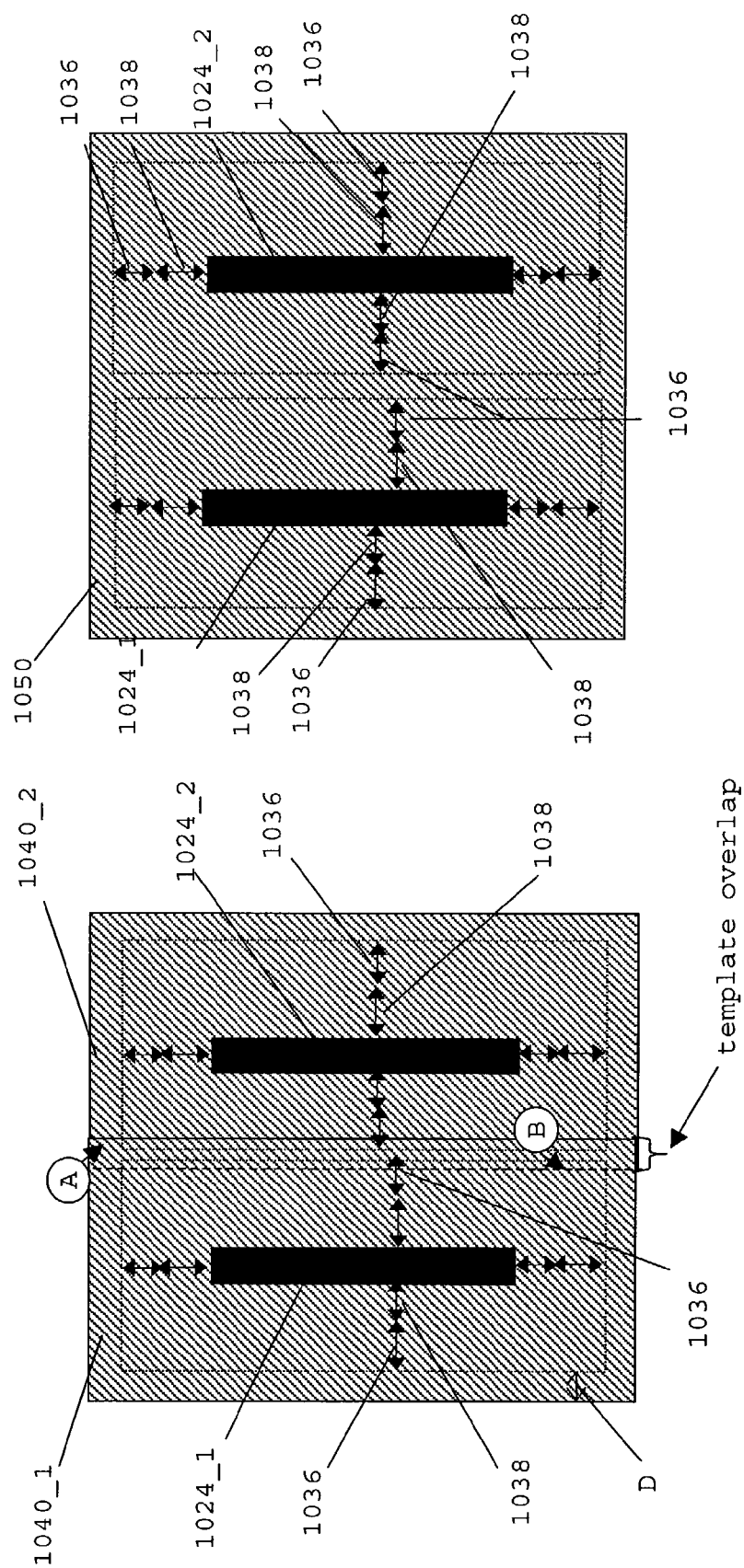

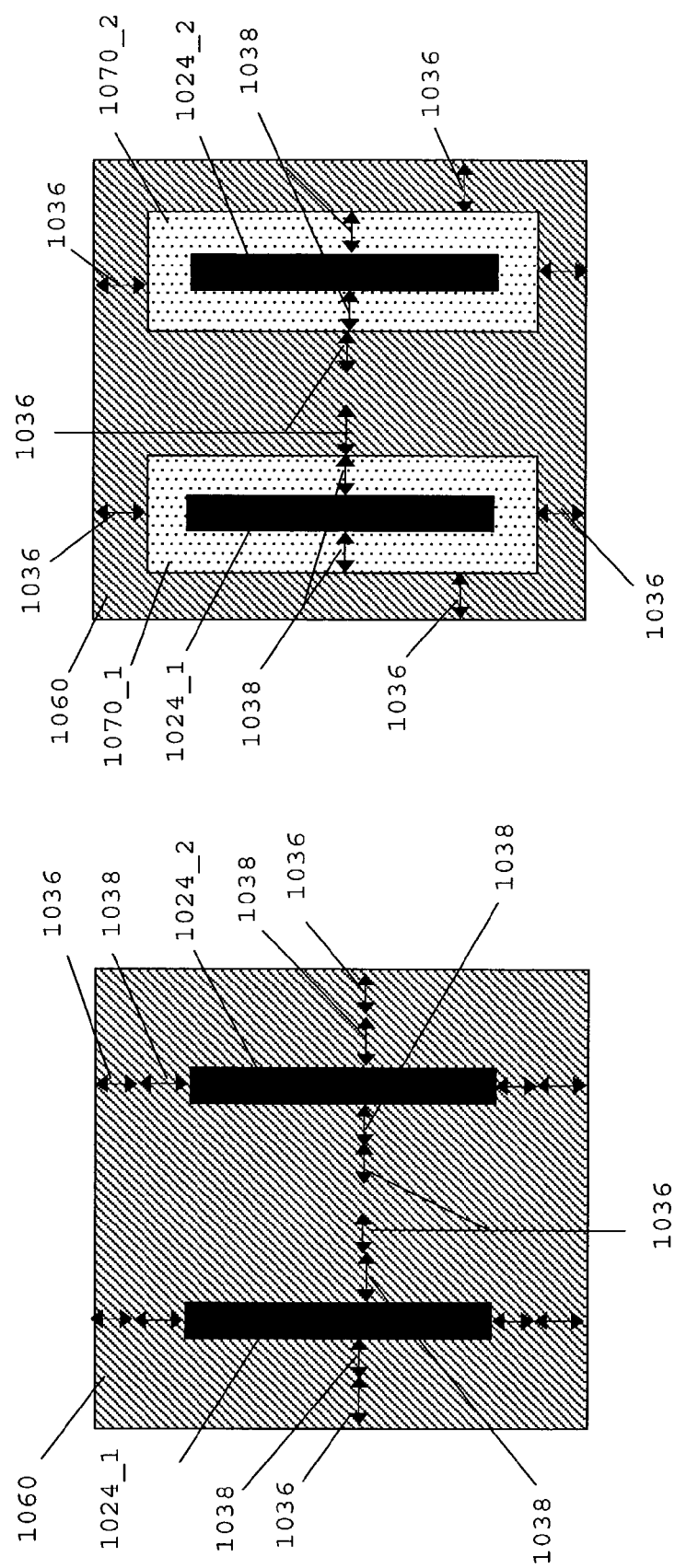

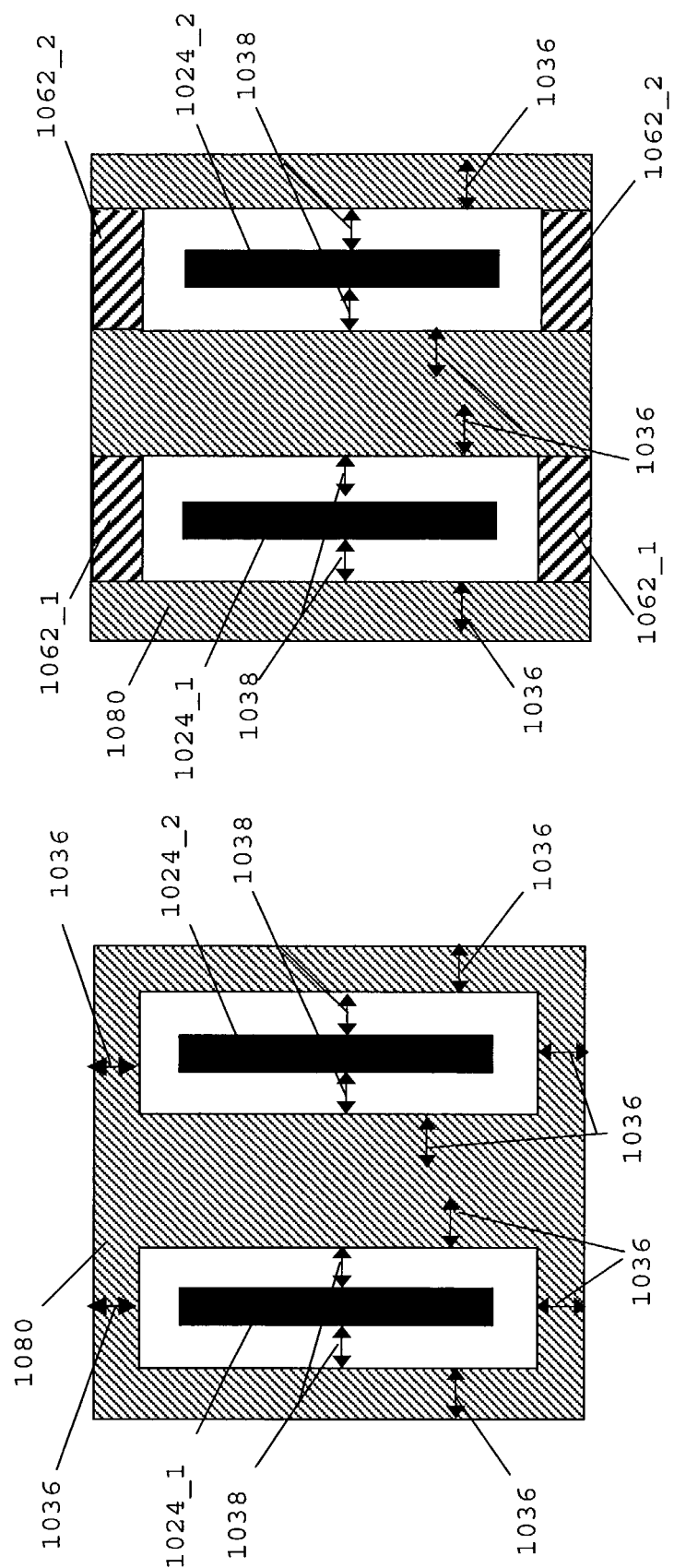

TOPOLOGY BASED WIRE SHIELDING GENERATION

BACKGROUND OF THE INVENTION

1. Field of the Invention

The present invention relates generally to integrated circuits, and more particularly to the generation of shielding wires in integrated circuits.

2. Description of Related Art

Integrated circuits are typically composed of a multitude of circuit components and interconnecting structures and are widely manufactured on semiconductor chips to process signals. Within a multi-layered integrated circuit chip, these circuit components and interconnecting structures can be located on one or more layers of the chip and can be connected to different power and ground networks of the chip.

One interconnecting structure used in integrated circuits is a signal wire. Typically, signal wires are routed on one or more metal layers of an integrated circuit chip. As there are only a limited number of metal layers in each chip, circuit designers attempt to make the most efficient use of the available routing space on a metal layer by maximizing the number of signal wires routed on a metal layer.

During the development of an integrated circuit design, signal wires are conventionally designed to a pre-determined signal wire pitch defined by a specified fabrication process or design parameter. In this instance, the term signal wire pitch refers to a distance between the center lines of two adjacent signal wires.

To aid in maintaining the integrity of a signal carried on a signal wire, shielding wires are often routed to each side of a signal wire to reduce the effects of electrical noise on a signal wire. Conventionally, the shielding wire to one side of a signal wire is assigned to a power network, and the shielding wire to the other side of the signal wire is assigned to a ground network. These assignments are typically made according to the design rules of a given integrated circuit.

If shielding wires are to be included in an integrated circuit design, the signal wire pitch must be large enough to accommodate the placement of the shielding wires. Conventionally, shielding wires are offset a pre-determined shielding wire pitch from the signal wire. In this instance, the term shielding wire pitch refers to a distance between the center lines of a signal wire and an adjacent shielding wire. Additionally, adjacent shielding wires are spaced apart according to design rule spacing parameters.

In some integrated circuit designs, a signal wire can be routed in different directions on the same metal layer of a chip, such as to route around various components. Thus, the signal wire can be routed in vertical and horizontal directions on the same metal layer. Typically, these changes in directions are made using wire jogs. In other integrated circuit designs, design rules can dictate that the signal wires be routed in a single direction on a metal layer. In these other designs, vertical segments of the signal wire can be routed on a metal layer different from the horizontal segments. The vertical and horizontal segments are then interconnected between the metal layers using conductive structures, such as vias.

FIG. 1 illustrates a general diagram of signal wires routed in different directions on the same metal layer of an integrated circuit chip according to the prior art. In FIG. 1, signal wires 116_1 and 116_2 are shown routed on metal layer 110 of an integrated circuit chip and interconnecting circuit components 112 and 114. If shielding wires are to be introduced in the design, the signal wire pitch 118 must be large enough to accommodate placement of the shielding wires.

FIG. 2 illustrates a general diagram of signal wires in which vertical and horizontal segments of the signal wires are routed on different metal layers in an integrated circuit according to the prior art. For example, in FIG. 2, design rules can dictate that signal wires be routed in the horizontal direction on metal layer 202 and in the vertical direction on metal layer 204. As illustrated, horizontal segments of signal wire 218 are routed in the horizontal direction on metal layer 202 and vertical segments of signal wire 218 are routed in the vertical direction on metal layer 204. Thus, to allow for direction changes, signal wire 218 is segmented between layers 202 and 204. Conductive interconnections between layers 202 and 204 (shown as dashed lines), such as vias, provide conductive continuity between the vertical and horizontal segments of the signal wire.

As can be appreciated from the illustrations of FIGS. 1 and 2, introduction of shielding wires to an integrated circuit design can be a complicated process as the routing can be required to be multi-directional on a single metal layer or may traverse several layers. Further, each shielding wire assignment to a power or ground network should be in accordance with the design rules for the particular integrated circuit.

Some prior art techniques attempted to generate shielding wire patterns by tracing the routing of each individual signal wire. The trace pattern is duplicated to each side of the signal wire and used as the shielding wire patterns. As shielding wire patterns are separately generated for each signal wire, duplicate shielding wires can be generated between adjacent signal wires, one for each signal wire.

In instances where adequate space was left between signal wires for the placement of shielding wires, the generation of duplicate shielding wires can fall within the design rules of the integrated circuit design. However, in some instances where adequate space was not left between signal wires, the generation of duplicate shielding wires can fall outside of the design rules, such as when the shielding wires overlap or do not have at least a minimum spacing between shielding wires.

Typically, design rule checking using this process can be performed concurrently with the shielding wire generation or as a separate process, but the design rule check is still separately performed for each separate signal wire. In instances, where duplicate, adjacent shielding wires exist between adjacent signal wires, assignment of one shielding wire to a power network and the other to a ground network can result in a power-ground short. In these situations, the design had to be reworked to correct the design rule violations.

To avoid these problems, other prior art techniques added shielding wires to integrated circuit designs either by custom coding the shielding wire design to a specific implementation or by using a full custom layout. Both of these approaches were time consuming and highly susceptible to errors. Additionally, once developed, the resultant custom software often could not be applied to newly integrated circuit designs or processes without significant effort.

Thus, it would be desirable to have a method and/or device that can rapidly, concurrently, and algorithmically generate a shielding wire topology for metal layers of an integrated circuit design that is design rule correct (DRC). Further, once the shielding wire topology is generated, the method and/or device would determine and assign power and ground nets to the shielding wires. Additionally, the method and/or device would be portable between designs and integrated circuit technologies.

SUMMARY OF THE INVENTION

The various embodiments of the present invention provide a topology based approach to shielding wire generation. The present invention creates various templates based on one or more respective signal wire geometries to generate associated shielding wire routing patterns. The present invention provides shielding wire generation for simple as well as complex signal wire geometries, such as branched signal wire geometries. The present invention can be applied to entire signal wire topologies having a plurality of adjacent signal wire geometries, such as those found in an integrated circuit bus. The topology based approach of the present invention can merge and alter the templates to avoid generation of duplicate, adjacent shielding wires, that are not design rule compliant.

The present invention can be implemented with existing computer-aided design (CAD) software. Further, the present invention can be implemented with CAD software together with a small amount of custom software to generate DRC clean shielding wire designs that utilize both power and ground networks. In the following examples, the present invention is described as implemented on the application, DIVA available from Cadence Design Systems, Inc. of San Jose, Calif. This program allows manipulation of geometries including the sizing up and sizing down of geometries together with concurrent design rule checking. Other programs having similar capabilities may also be used, such as DRACULA also available from Cadence Design Systems, Inc. of San Jose, Calif.

According to one embodiment of the present invention, a method for generating a shielding wire pattern includes: obtaining a signal wire geometry; geometrically generating one or more templates based upon the signal wire geometry; and geometrically adding or subtracting all or a portion of the templates to one another to generate one or more shielding wire patterns.

In another embodiment, a method for generating a shielding wire pattern includes: obtaining a signal wire geometry, the signal wire geometry having terminal ends; sizing up the signal wire geometry to generate a first template having a first geometry and a first area; sizing up the signal wire geometry to generate a second template having a second geometry and a second area; geometrically subtracting the second template from the first template to generate a third template having a third geometry and a third area; sizing up the terminal ends of the signal wire geometry to generate one or more terminal areas of the third template, each of the terminal areas having a terminal geometry and terminal area; and geometrically subtracting the one or more terminal areas from the third template to generate one or more shielding wire patterns having a shielding wire geometry.

In yet another embodiment, a method for generating a branched shielding wire pattern includes: obtaining a branched signal wire geometry, the branched signal wire geometry having terminal ends; sizing up the branched signal wire geometry to generate a first template having a first geometry and a first area; sizing up the branched signal wire geometry to generate a second template having a second geometry and a second area; geometrically subtracting the second template from the first template to generate a third template having a third geometry and a third area; sizing up the terminal ends of the signal wire geometry to generate one or more terminal areas of the third template, each of the terminal areas having a terminal geometry and terminal area; and geometrically subtracting the one or more terminal areas from the third template to generate one or more shielding wire patterns having a shielding wire geometry.

In a further embodiment, a method for generating a shielding wire pattern includes: obtaining a first signal wire geometry, the first signal wire geometry having first terminal ends; obtaining a second signal wire geometry, the second signal wire geometry being adjacent to the first signal wire geometry and having second terminal ends; geometrically sizing up the first signal wire geometry to generate a first template having a first geometry and a first area; geometrically sizing up the second signal wire geometry to generate a second template having a second geometry and a second area, the first template and the second template producing a template overlap of duplicate areas; geometrically merging the first template and the second template to generate a third template having a third geometry and a third area, wherein in geometrically merging the first template and the second template, the first template and the second template are geometrically added and one of the duplicate areas is geometrically subtracted; geometrically sizing up the first signal wire geometry to generate a fourth template having a fourth geometry and a fourth area; geometrically sizing up the second signal wire geometry to generate a fifth template having a fifth geometry and a fifth area; geometrically subtracting the fourth template and the fifth template from the third template to generate a sixth template having a sixth geometry and a sixth area; sizing up the first and second terminal ends of the first and second signal wire geometries to generate one or more terminal areas of the sixth template, each of the terminal areas having a terminal geometry and terminal area; and geometrically subtracting the one or more terminal areas from the sixth template to generate one or more shielding wire patterns having a shielding wire geometry.

In another embodiment, a method for generating a shielding wire pattern includes: obtaining a first signal wire geometry, the first signal wire geometry having first terminal ends; obtaining a second signal wire geometry, the second signal wire geometry being adjacent to the first signal wire geometry and having second terminal ends; geometrically sizing up the first signal wire geometry to generate a first template having a first geometry and a first area; geometrically sizing up the second signal wire geometry to generate a second template having a second geometry and a second area, the first template and the second template not producing a template overlap; geometrically sizing up the first template by a pre-determined distance, D, to generate a third template having a third geometry and a third area; geometrically sizing up the second template by the pre-determined distance, D, to generate a fourth template having a fourth geometry and a fourth area, the third and fourth templates producing a template overlap of duplicate areas; geometrically merging the third template and the fourth template to generate a fifth template having a fifth geometry and a fifth area, wherein in geometrically merging the third template and the fourth template, the third template and the fourth template are geometrically added and one of the duplicate areas is geometrically subtracted; geometrically sizing down the fifth template to generate a sixth template having a sixth geometry and a sixth area; geometrically sizing up the first signal wire geometry to generate a seventh template having a seventh geometry and a seventh area; geometrically sizing up the second signal wire geometry to generate an eighth template having an eighth geometry and an eighth area;

geometrically subtracting the seventh template and the eighth template from the sixth template to generate a ninth template having a ninth geometry and a ninth area; sizing up the first and second terminal ends of the first and second signal wire geometries to generate one or more terminal areas of the ninth template, each of the terminal areas having a terminal geometry and terminal area; and geometrically subtracting the one or more terminal areas from the ninth template to generate one or more shielding wire patterns having a shielding wire geometry.

In yet another embodiment, a computer program product has stored thereon computer readable instructions wherein execution of the computer readable instructions generates a method for generating a shielding wire pattern, the method including: obtaining a signal wire geometry; geometrically generating one or more templates based upon the signal wire geometry; and geometrically adding or subtracting all or a portion of the templates to one another to generate one or more shielding wire patterns.

In a further embodiment, a computer program product has stored thereon computer readable instructions wherein execution of the computer readable instructions generates a method for generating a shielding wire pattern, the method including: obtaining a signal wire geometry, the signal wire geometry having terminal ends; sizing up the signal wire geometry to generate a first template having a first geometry and a first area; sizing up the signal wire geometry to generate a second template having a second geometry and a second area; geometrically subtracting the second template from the first template to generate a third template having a third geometry and a third area; sizing up the terminal ends of the signal wire geometry to generate one or more terminal areas of the third template, each of the terminal areas having a terminal geometry and terminal area; and geometrically subtracting the one or more terminal areas from the third template to generate one or more shielding wire patterns having a shielding wire geometry.

In another embodiment, a computer program product has stored thereon computer readable instructions wherein execution of the computer readable instructions generates a method for generating a branched shielding wire pattern, the method including: obtaining a branched signal wire geometry, the branched signal wire geometry having terminal ends; sizing up the branched signal wire geometry to generate a first template having a first geometry and a first area; sizing up the branched signal wire geometry to generate a second template having a second geometry and a second area; geometrically subtracting the second template from the first template to generate a third template having a third geometry and a third area; sizing up the terminal ends of the signal wire geometry to generate one or more terminal areas of the third template, each of the terminal areas having a terminal geometry and terminal area; and geometrically subtracting the one or more terminal areas from the third template to generate one or more shielding wire patterns having a shielding wire geometry.

In yet another embodiment, a computer program product has stored thereon computer readable instructions wherein execution of the computer readable instructions generates a method for generating a shielding wire pattern, the method including: obtaining a first signal wire geometry, the first signal wire geometry having first terminal ends; obtaining a second signal wire geometry, the second signal wire geometry being adjacent to the first signal wire geometry and having second terminal ends; geometrically sizing up the first signal wire geometry to generate a first template having a first geometry and a first area; geometrically sizing up the second signal wire geometry to generate a second template having a second geometry and a second area, the first template and the second template producing a template overlap of duplicate areas; geometrically merging the first template and the second template to generate a third template having a third geometry and a third area, wherein in geometrically merging the first template and the second template, the first template and the second template are geometrically added and one of the duplicate areas is geometrically subtracted; geometrically sizing up the first signal wire geometry to generate a fourth template having a fourth geometry and a fourth area; geometrically sizing up the second signal wire geometry to generate a fifth template having a fifth geometry and a fifth area; geometrically subtracting the fourth template and the fifth template from the third template to generate a sixth template having a sixth geometry and a sixth area; sizing up the first and second terminal ends of the first and second signal wire geometries to generate one or more terminal areas of the sixth template, each of the terminal areas having a terminal geometry and terminal area; and geometrically subtracting the one or more terminal areas from the sixth template to generate one or more shielding wire patterns having a shielding wire geometry.

In a further embodiment, a computer program product has stored thereon computer readable instructions wherein execution of the computer readable instructions generates a method for generating a shielding wire pattern, the method including: obtaining a first signal wire geometry, the first signal wire geometry having first terminal ends; obtaining a second signal wire geometry, the second signal wire geometry being adjacent to the first signal wire geometry and having second terminal ends; geometrically sizing up the first signal wire geometry to generate a first template having a first geometry and a first area; geometrically sizing up the second signal wire geometry to generate a second template having a second geometry and a second area, the first template and the second template not producing a template overlap; geometrically sizing up the first template by a pre-determined distance, D, to generate a third template having a third geometry and a third area; geometrically sizing up the second template by the pre-determined distance, D, to generate a fourth template having a fourth geometry and a fourth area, the third and fourth templates producing a template overlap of duplicate areas; geometrically merging the third template and the fourth template to generate a fifth template having a fifth geometry and a fifth area, wherein in geometrically merging the third template and the fourth template, the third template and the fourth template are geometrically added and one of the duplicate areas is geometrically subtracted; geometrically sizing down the fifth template to generate a sixth template having a sixth geometry and a sixth area; geometrically sizing up the first signal wire geometry to generate a seventh template having a seventh geometry and a seventh area; geometrically sizing up the second signal wire geometry to generate an eighth template having an eighth geometry and an eighth area; geometrically subtracting the seventh template and the eighth template from the sixth template to generate a ninth template having a ninth geometry and a ninth area; sizing up the first and second terminal ends of the first and second signal wire geometries to generate one or more terminal areas of the ninth template, each of the terminal areas having a terminal geometry and terminal area; and geometrically subtracting the one or more terminal areas from the ninth template to generate one or more shielding wire patterns having a shielding wire geometry.

It can be understood that both the foregoing general description and the following detailed description are intended only to exemplify and explain the invention as claimed.

BRIEF DESCRIPTION OF THE DRAWINGS

The accompanying drawings, which are incorporated in, and constitute a part of this specification, illustrate embodiments of the present invention and, together with the description, serve to explain the advantages and principles of the present invention. In the drawings:

FIG. 5A illustrates a branched signal wire geometry according to one embodiment of the present invention;

FIG. 5B illustrates sizing up of the branched signal wire geometry of FIG. 5A to generate a first template according to one embodiment of the present invention;

FIG. 5E illustrates sizing up of the terminal ends of the branched signal wire geometry to generate one or more terminal areas of the third template according to one embodiment of the present invention;

FIG. 5F illustrates shielding wire patterns remaining after geometric subtraction of the terminal areas from the third template according to one embodiment of the present invention;

FIG. 8G illustrates geometric subtraction of the terminal areas from the sixth template to produce one or more shielding wire geometries according to one embodiment of the present invention;

FIG. 10C illustrates the sizing up of the first template and the second template to generate a template overlap according to one embodiment of the present invention;

FIG. 10D illustrates geometrically merging the third template and the fourth template to generate a fifth template according to one embodiment of the present invention;

FIG. 10E illustrates sizing down of the fifth template to generate a sixth template according to one embodiment of the present invention;

FIG. 10F illustrates sizing up of the first and second signal wire geometries to generate seventh and eighth templates according to one embodiment of the present invention;

FIG. 10G illustrates geometric subtraction of the seventh and eighth templates from the sixth template resulting in a ninth template according to one embodiment of the present invention;

FIG. 10H illustrates sizing up of the terminal ends of the first and second signal wire geometries to generate one or more terminal areas of the ninth template according to one embodiment of the present invention;

DETAILED DESCRIPTION

The invention will now be described with reference to the accompanying drawings. The various embodiments of the present invention provide a topology based approach to shielding wire generation. Rather than separately generating shielding wires for each signal wire by tracing each signal wire or by custom coded software for a specific circuit design, as seen in the prior art, the present invention generates shielding wires based on the entire signal wire topology of a metal layer and is portable between different integrated circuit designs.

The present invention provides shielding wire generation for simple as well as complex signal wire geometries, such as branched signal wire geometries. The present invention can be applied to entire signal wire topologies having a plurality of adjacent signal wire geometries, such as those found in an integrated circuit bus. The topology based approach of the present invention can merge and alter the templates to avoid generation of duplicate, adjacent shielding wires, that are not design rule compliant.

The present invention can be implemented with existing computer-aided design (CAD) software. Further, the present invention can be implemented with CAD software together with a small amount of custom software to generate DRC clean shielding wire designs that utilize both power and ground networks. In the following examples, the present invention is described as implemented on the application, DIVA available from Cadence Design Systems, Inc. of San Jose, Calif. This program allows manipulation of geometries including the sizing up and sizing down of geometries together with concurrent design rule checking. Other programs having similar capabilities may also be used, such as DRACULA also available from Cadence Design Systems, Inc. of San Jose, Calif.

Figure 1:
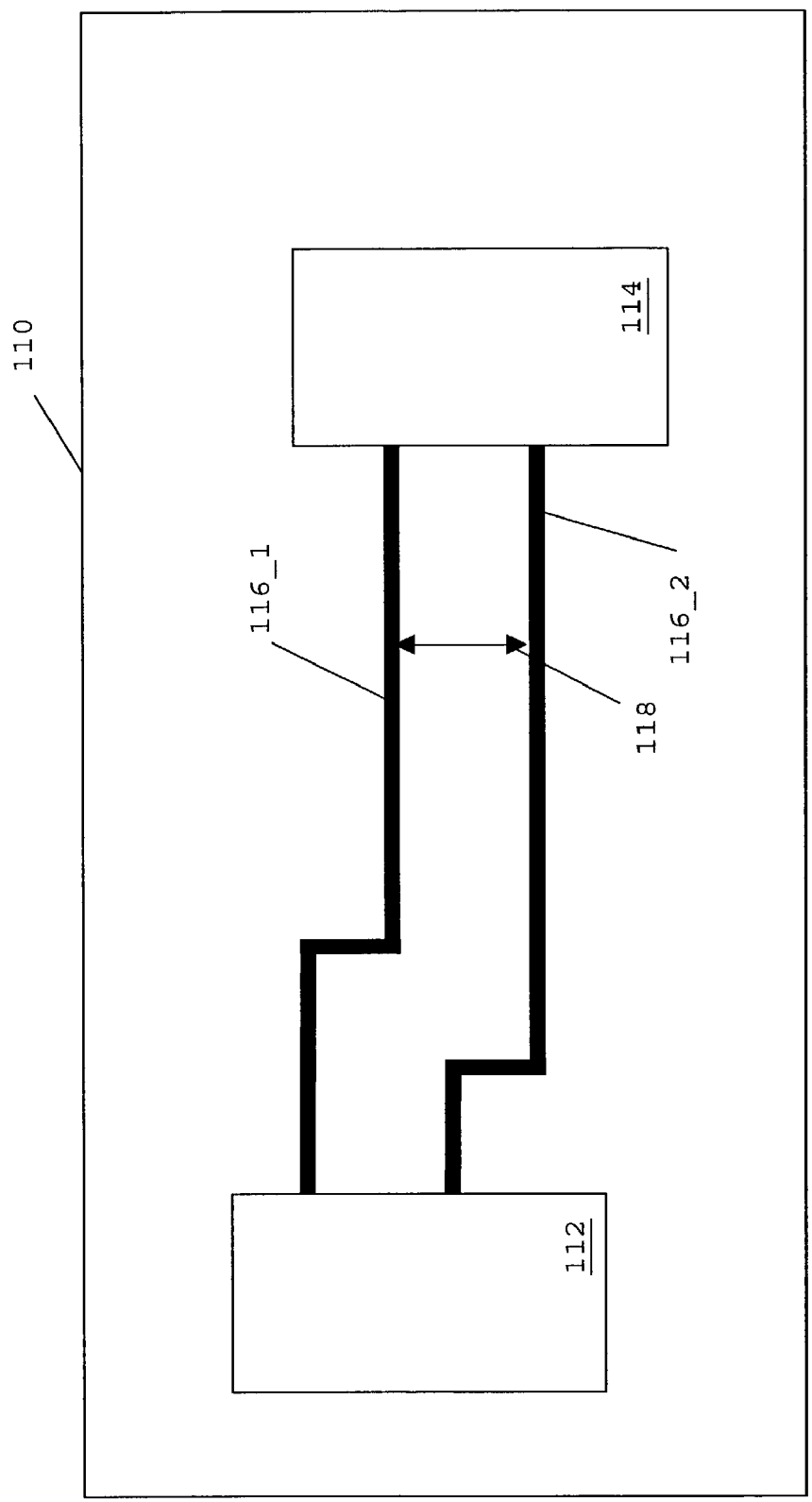
FIG. 1 illustrates a general diagram of signal wires routed in different directions on the same metal layer of an integrated circuit chip according to the prior art.
Figure 2:
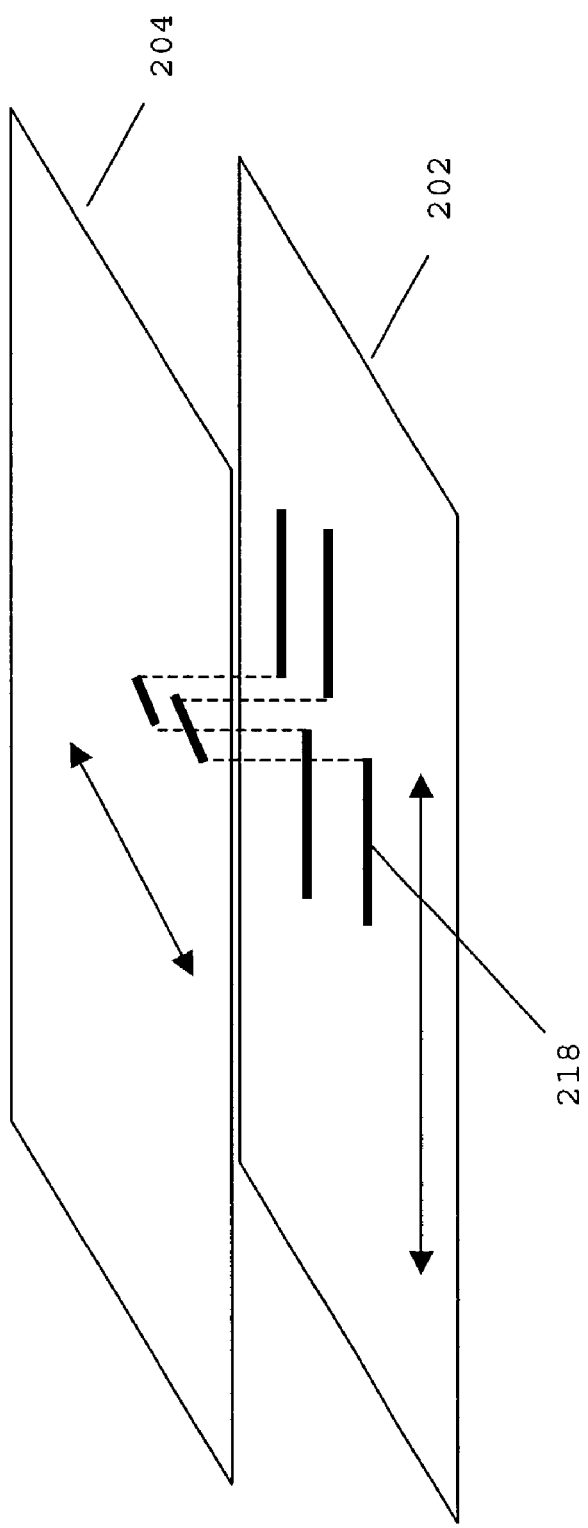
FIG. 2 illustrates a general diagram of signal wires in which vertical and horizontal segments of the signal wires are routed on different metal layers in an integrated circuit according to the prior art.
Figures 3A, 3B:
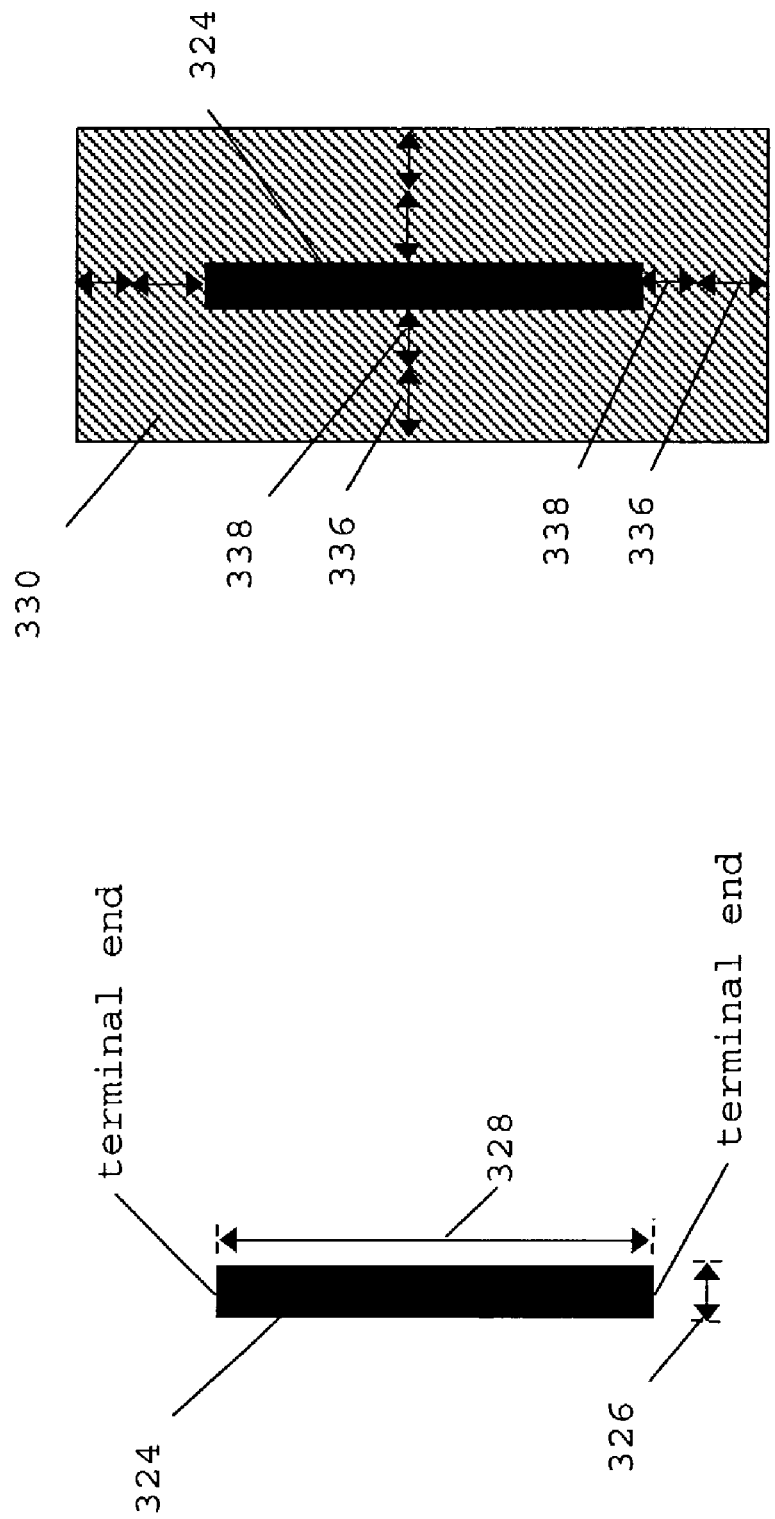
FIG. 3A illustrates a simple signal wire geometry according to one embodiment of the present invention.
FIG. 3B illustrates sizing up of the signal wire geometry of FIG. 3A to generate a first template according to one embodiment of the present invention.

FIGS. 3A through 3F illustrate a method for topology based shielding wire generation as applied to a signal wire geometry according to one embodiment of the present invention. FIG. 3A illustrates a simple signal wire geometry according to one embodiment of the present invention. The signal wire geometry 324 can be obtained in any of a variety of ways. In one example, the signal wire geometry 324 is obtained from an integrated circuit design, such as may be found in a memory structure utilized with conventional design tools, such as Virtuoso Layout Editor available from Cadence Design Systems, Inc. of San Jose, Calif.

In this example, the signal wire geometry 324 includes a wire width 326 and a wire length 328 and has a resultant area. The calculation of area for geometric figures is well-known to those of skill in the art and is not further described herein. The shortest edges of the signal wire geometry 324 are termed the "terminal ends".

FIG. 3B illustrates sizing up of the signal wire geometry of FIG. 3A to generate a first template according to one embodiment of the present invention. Once signal wire geometry 324 is obtained, in one embodiment, a first template 330 is generated based upon signal wire geometry 324. In this example, signal wire geometry 324 is sized up a distance equal to a shielding wire width 336 plus a shielding wire pitch 338 to generate a first template 330. Sizing up can also be termed an over sizing, or geometric expansion of signal wire geometry 324. Thus, first template 330 has a first geometry with a resultant first area that is greater than that of signal wire geometry 324. Following generation of first template 330, a second template is generated.

Figure 3D:
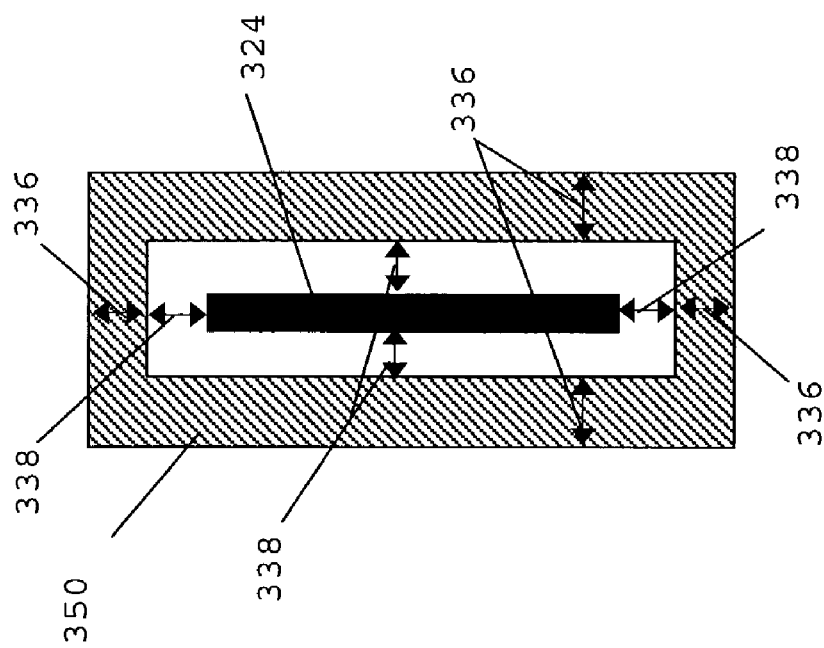
FIG. 3D illustrates generation of a third template by geometric subtraction of the second template from the first template according to one embodiment of the present invention.
Figure 3C:
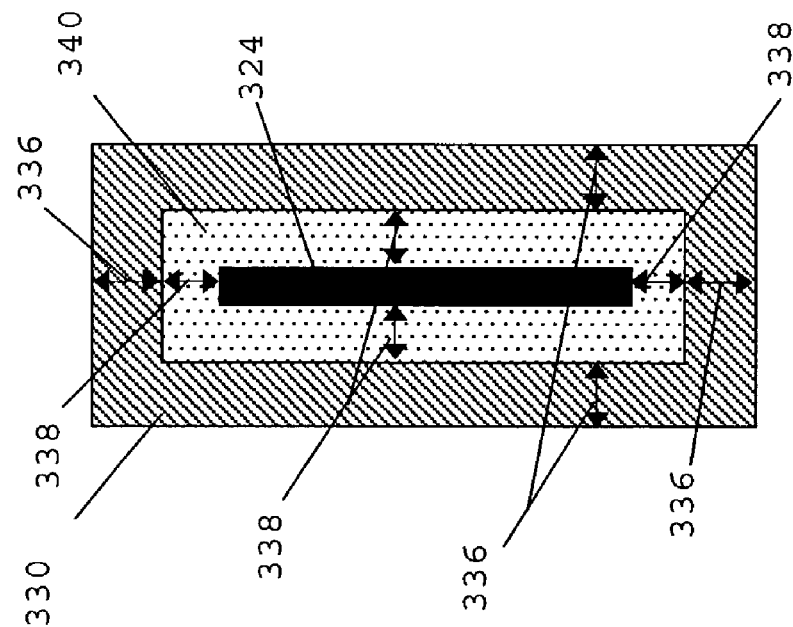
FIG. 3C illustrates sizing up of the signal wire geometry of FIG. 3A to generate a second template according to one embodiment of the present invention.

FIG. 3C illustrates sizing up of the signal wire geometry of FIG. 3A to generate a second template according to one embodiment of the present invention. In FIG. 3C, signal wire geometry 324 is sized up a distance equal to a shielding wire pitch 338 to generate a second template 340. Second template 340 has a second geometry with a resultant second area that is greater than that of signal wire geometry 324 but less than that of first template 330. Following generation of second template 340, a third template is generated by subtracting second template 340 from first template 330.

FIG. 3D illustrates generation of a third template by geometric subtraction of the second template from the first template according to one embodiment of the present invention. As illustrated, geometric subtraction of second template 340 from first template 330 results in a third template 350 surrounding signal wire geometry 324. Geometric subtraction and addition of figures is well-known to those of skill in the art and not further described herein. The resulting third template 350 has a third geometry with a third area that is geometrically spaced apart from signal wire geometry 324 a distance equal to a shielding wire pitch 338. As seen in FIG. 3D, the beginnings of shielding wire patterns having shielding wire width 336 are forming to each side of signal wire geometry 324. However, areas of third template 350 opposite the terminal ends of the signal wire geometry 324 need to be removed.

Figure 3F:
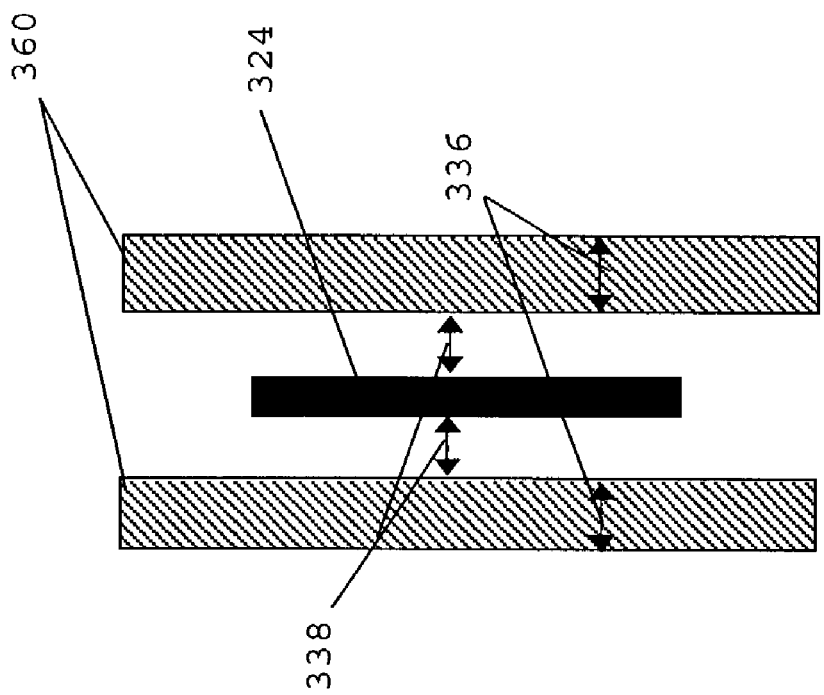
FIG. 3F illustrates shielding wire geometries remaining after geometric subtraction of the terminal areas from the third template according to one embodiment of the present invention.
Figure 3E:
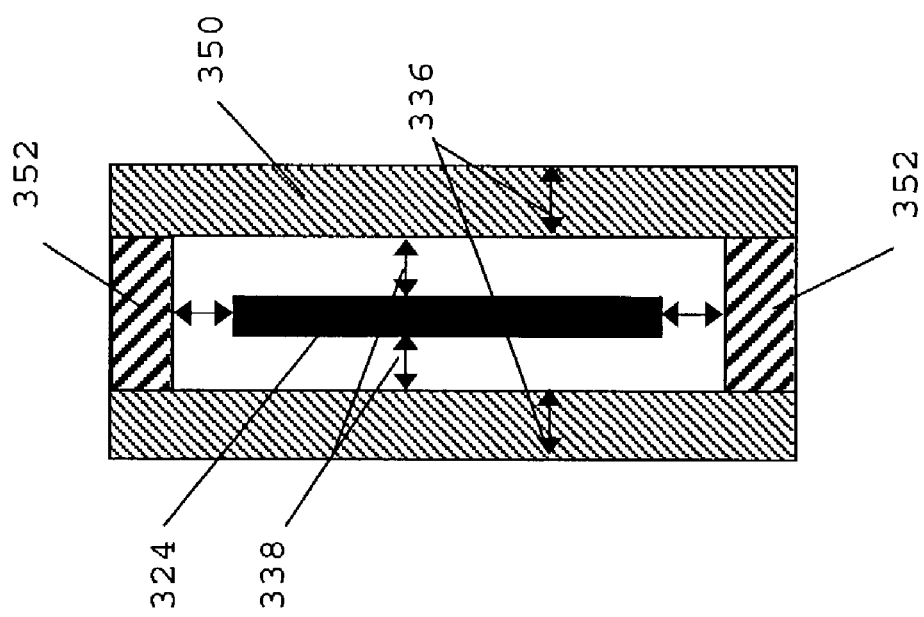
FIG. 3E illustrates sizing up of the terminal ends of the signal wire geometry to generate one or more terminal areas of the third template according to one embodiment of the present invention.

FIG. 3E illustrates sizing up of the terminal ends of the signal wire geometry to generate one or more terminal areas of the third template according to one embodiment of the present invention. In FIG. 3E, the terminal ends of the signal wire geometry 324 are sized up to the outer edges of the third template 350 opposite the terminal ends and to each side a signal wire pitch 338 to generate terminal areas 352. Once the terminal areas 352 are generated, they are geometrically subtracted from the third template 350.

FIG. 3F illustrates shielding wire geometries remaining after geometric subtraction of the terminal areas from the third template according to one embodiment of the present invention. In FIG. 3F, geometric subtraction of the terminal areas 352 from the third template 350 (see FIG. 3E) results in one or more shielding wire geometries 360 spaced a shielding wire pitch 338 away from signal wire geometry 324 and having a shielding wire width 336. Viewed another way, following geometric subtraction of the terminal areas 352, the remaining portions of the third template 350 represent shielding wire patterns.

In this way, shielding wire patterns can be generated using the geometry of the signal wire or signal wires present on a metal layer. The various parameters used in generating the shielding wire patterns, such as signal wire pitch, shielding wire pitch, and shielding wire width, can be easily set as parameters in a CAD tool, and then utilized or changed as needed for a different application.

Figure 4:
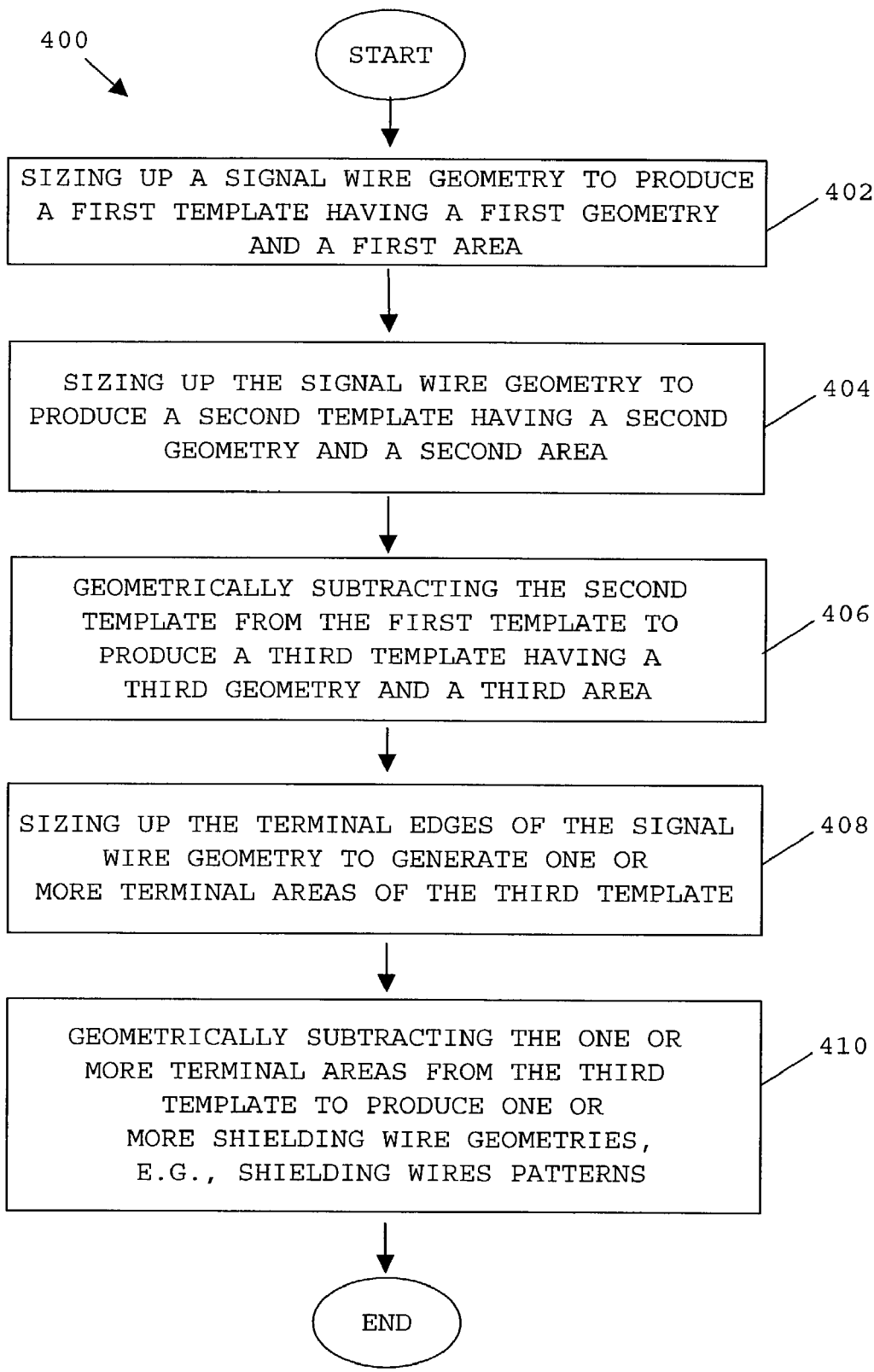
FIG. 4 illustrates a process flow diagram of a method for topology based shielding wire generation as described with reference to FIGS. 3A through 3F according to one embodiment of the present invention.

FIG. 4 illustrates a process flow diagram of a method for topology based shielding wire generation as described with reference to FIGS. 3A through 3F according to one embodiment of the present invention.

As seen in FIG. 4, according to method 400, in operation 402, a signal wire geometry is sized up to produce a first template having a first geometry with a first area. In sizing up a signal wire geometry, the geometry of the signal wire is used as the basis for a geometrical expansion of the signal wire geometry to generate another geometry, such as a template, which is larger than the signal wire geometry.

For example, referring to FIGS. 3A and 3B, signal wire geometry 324 is sized up a distance equal to a shielding wire pitch 338 plus a shielding wire width 336 to generate first template 330.

Returning to FIG. 4, in operation 404, the signal wire geometry is sized up to produce a second template having a second geometry with a second area.

For example, referring to FIG. 3C, signal wire geometry 324 is sized up a distance equal to a shielding wire pitch 338 to form second template 340 that is larger than signal wire geometry 324 and smaller than first template 330.

Returning to FIG. 4, in operation 406, the area of the second template is geometrically subtracted from the area of the first template to produce a remainder third template having a third geometry and a third area.

For example, referring to FIG. 3D, second template 340 is geometrically subtracted from first template 330 leaving third template 350. Third template 350 surrounds signal wire geometry 324 at an offset equal to shielding wire pitch 338 and having shielding wire width 336.

Returning to FIG. 4, in operation 408, the terminal ends of the signal wire geometry are sized up to generate one or more terminal areas in the third template.

For example, referring to FIG. 3E, as earlier described, terminal areas 352 of third template 350 are generated by sizing up the terminal ends of the signal wire geometry 324 to the outside edges of the third template 350 that are opposite the terminal ends and out a signal wire pitch 338 to each side.

Returning to FIG. 4, in operation 410, the terminal areas are geometrically subtracted from the third template to generate one or more fourth templates having fourth geometries and fourth areas.

For example, referring to FIG. 3F, geometric subtraction of terminal areas 352 from third template 350, result in the generation of shielding wire geometries 360 having shielding wire width 336.

The process flow diagram of FIG. 4 together with FIGS. 3A through 3F have illustrated basic aspects of the present invention as applied to a simple signal wire geometry. As the present invention is applicable to an overall signal wire topology, the present invention can be applied to more complex signal wire geometries.

Figure 5D:
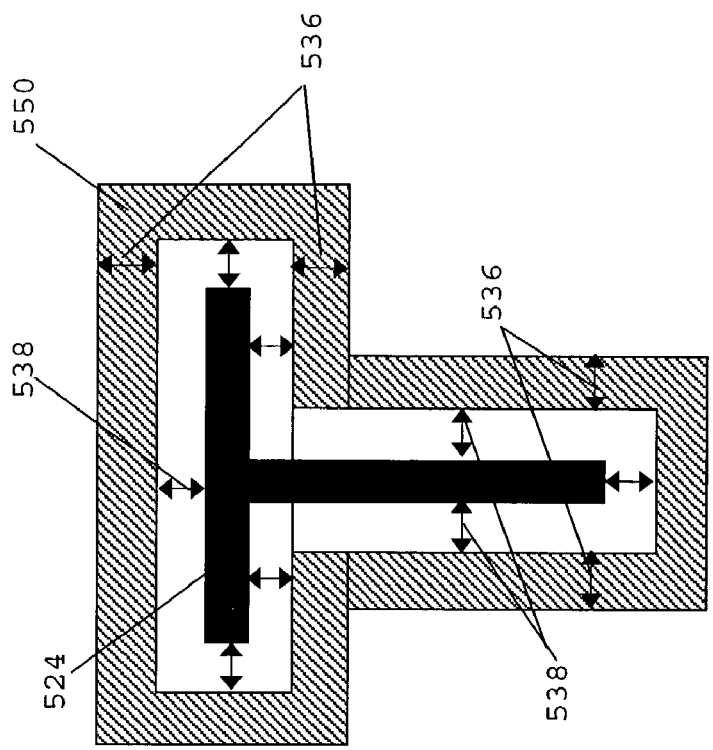
FIG. 5D illustrates generation of a third template by geometric subtraction of the second template from the first template according to one embodiment of the present invention.

FIGS. 5A through 5F illustrate a method for topology based shielding wire generation as applied to a complex signal wire geometry, such as a branched signal wire geometry. FIG. 5A illustrates a branched signal wire geometry according to one embodiment of the present invention. In FIG. 5A, branched signal wire geometry 524 has an area, as well as terminal ends.

FIG. 5B illustrates sizing up of the branched signal wire geometry of FIG. 5A to generate a first template according to one embodiment of the present invention. Once obtained, in one embodiment, branched signal wire geometry 524 is sized up a distance equal to a shielding wire width 536 plus a shielding wire pitch 538 to generate first template 530. First template 530 has a first geometry with a resultant first area that is greater than that of branched signal wire geometry 524. Following generation of first template 530, a second template is generated from branched signal wire geometry 524.

Figure 5C:
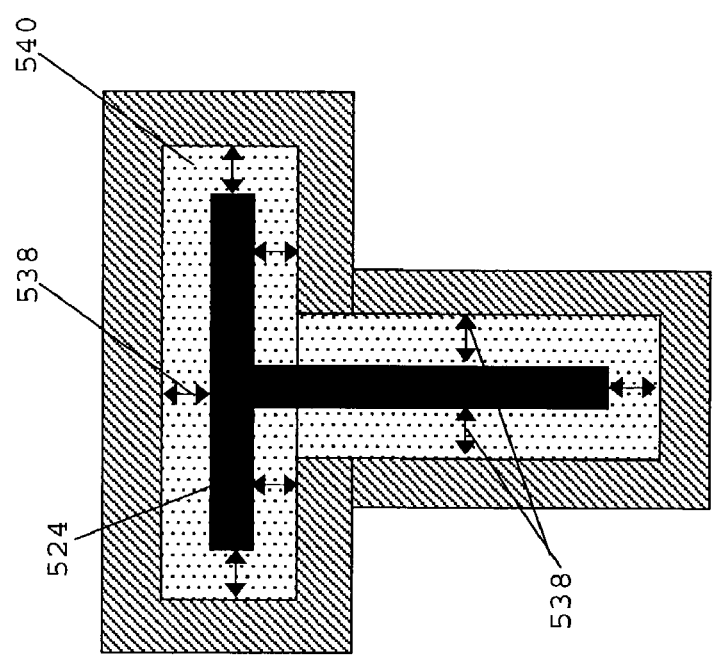
FIG. 5C illustrates sizing up of the branched signal wire geometry of FIG. 5A to generate a second template according to one embodiment of the present invention.

FIG. 5C illustrates sizing up of the branched signal wire geometry of FIG. 5A to generate a second template according to one embodiment of the present invention. Branched signal wire geometry 524 is sized up a distance equal to a shielding wire pitch 538 to generate a second template 540. Second template 540 has a second geometry with a resultant second area that is greater than that of branched signal wire geometry 524 but less than that of first template 530. Following generation of second template 540, a third template is generated by geometrically subtracting second template 540 from first template 530.

FIG. 5D illustrates generation of a third template by geometric subtraction of the second template from the first template according to one embodiment of the present invention. As illustrated, geometric subtraction of second template 540 from first template 530 results in a third template 550 surrounding branched signal wire geometry 524. The resulting third template 550 has a third geometry with a third area that is geometrically spaced apart from branched signal wire geometry 524 a distance equal to a shielding wire pitch 538. As shown in FIG. 5D, the beginnings of shielding wire patterns having shielding wire width 536 are forming to each side of branched signal wire geometry 524. Next, areas of third template 550 opposite the terminal ends of the branched signal wire geometry 524 need to be removed.

FIG. 5E illustrates sizing up of the terminal ends of the branched signal wire geometry to generate one or more terminal areas of the third template according to one embodiment of the present invention. In FIG. 5E, the terminal ends of the branched signal wire geometry 524 are sized up to the outer edges of the third template 550 opposite the terminal ends and to each side a signal wire pitch 538 to generate terminal areas 552. Once the terminal areas 552 are generated, they are geometrically subtracted from the third template 550.

FIG. 5F illustrates shielding wire patterns remaining after geometric subtraction of the terminal areas from the third template according to one embodiment of the present invention. In FIG. 5F, geometric subtraction of the terminal areas 552 from the third template 550 (FIG. 5E) results in one or more shielding wire geometries 560 spaced a shielding wire pitch 538 apart from signal wire geometry 524 and having a shielding wire width 536. Viewed another way, following geometric subtraction of the terminal areas 552, the remaining portions of the third template 550 represent shielding wire patterns.

Figure 6:
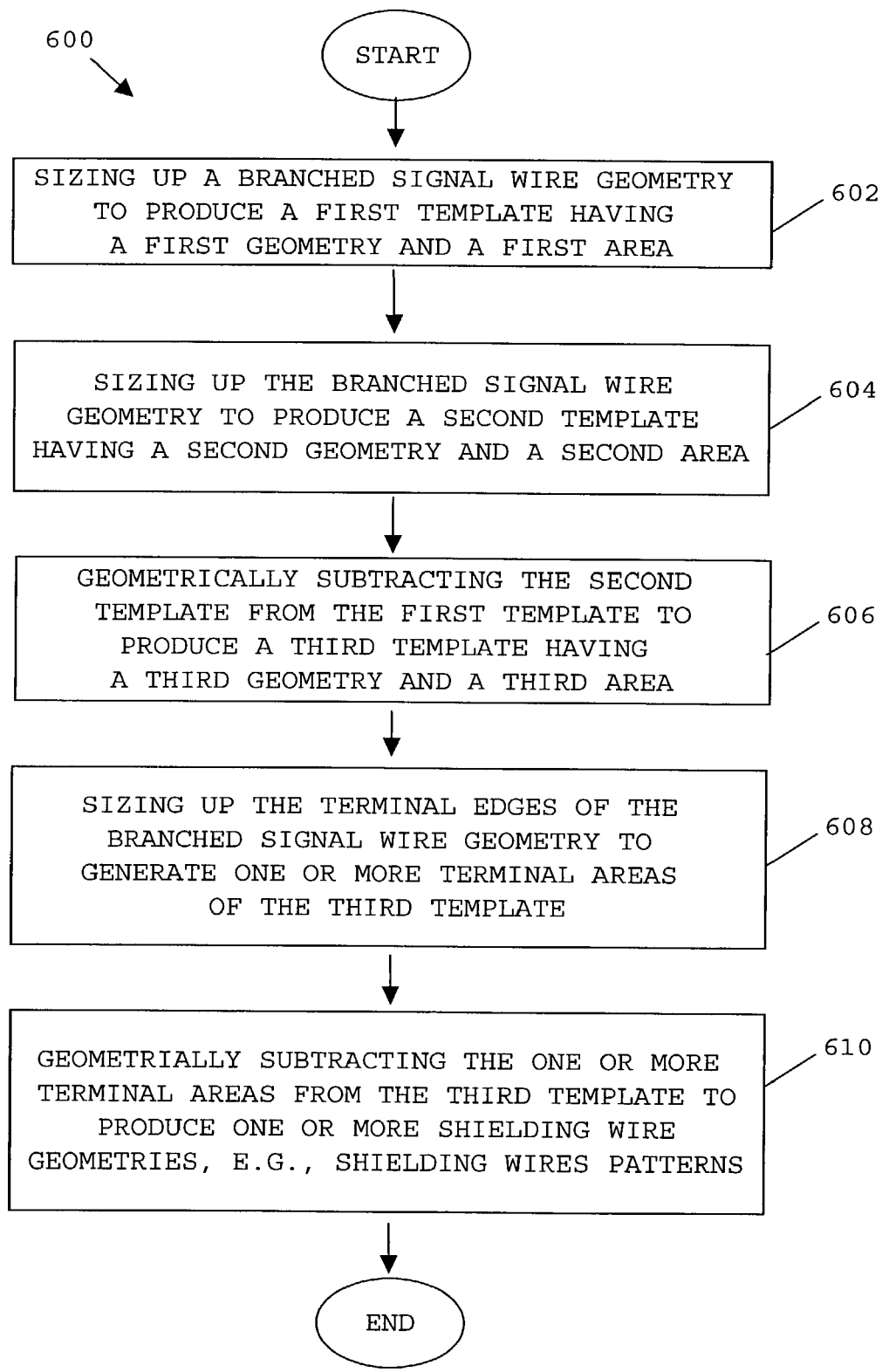
FIG. 6 illustrates a process flow diagram of a method for topology based shielding wire generation as described with reference to FIGS. 5A through 5F according to one embodiment of the present invention.

FIG. 6 illustrates a process flow diagram of a method for topology based shielding wire generation as described with reference to FIGS. 5A through 5F according to one embodiment of the present invention.

As seen in FIG. 6, according to method 600, in operation 602, a signal wire geometry is sized up to produce a first template having a first geometry with a first area.

For example, referring to FIGS. 5A and 5B, branched signal wire geometry 524 is sized up a distance equal to a shielding wire pitch 538 plus a shielding wire width 536 to form a first template 530.

Returning to FIG. 6, in operation 604, the branched signal wire geometry is sized to produce a second template having a second geometry with a second area.

For example, referring to FIG. 5C, branched signal wire geometry 524 is sized up a distance equal to a shielding wire pitch 538 to form second template 540.

Returning to FIG. 6, in operation 606, the area of the second template is geometrically subtracted from the area of the first template to produce a remainder third template having a third geometry and a third area.

For example, referring to FIG. 5D, second template 540 is geometrically subtracted from first template 530 leaving third template 550. Third template 550 surrounds branched signal wire geometry 524 at an offset equal to shielding wire pitch 538 and having shielding wire width 536.

Returning to FIG. 6, in operation 608, the terminal ends of the branched signal wire geometry are sized up to generate one or more terminal areas in the third template.

For example, referring to FIG. 5E, as earlier described, terminal areas 552 of third template 550 are generated by sizing up the terminal ends of the branched signal wire geometry 524 to the outside edges of the third template 350 that are opposite the terminal ends and out a signal wire pitch 338 to each side.

Returning to FIG. 6, in operation 610, the terminal areas are geometrically subtracted from the third template to generate one or more shielding wire geometries.

For example, referring to FIG. 5F, geometric subtraction of terminal areas 552 from the third template 550, results in generation of shielding wire geometries 560 having shielding wire width 536.

Thus, as described above, the present invention can generate associated shielding wire patterns for complex geometries, such as branched signal wire geometries.

The present invention can also be applied to entire signal wire topologies having a plurality of adjacent signal wire geometries, such as those found in an integrated circuit bus. The topology based approach of the present invention allows templates of adjacent signal wire geometries to be merged and altered so that duplicate shielding wire generation that is not design rule compliant can be avoided.

The initial design placement relationship of adjacent signal wires in a wire topology can vary such that the amount of space between adjacent signal wires available for placement of shielding wires may not be sufficient for generation of duplicate shielding wires that are design rule compliant, such as adjacent shielding wires that overlap or too close together. Application of the present invention to entire signal wire topologies having adjacent signal wires, provides design rule checking and can merge and alter templates to generate DRC compliant shielding wire(s). For purposes of illustration, application of the present invention to four examples of placement relationships of adjacent signal wires is now described.

In a first instance, the initial design placement relationship is such that a first signal wire geometry and a second signal wire geometry are spaced twice a shielding wire pitch plus a shielding wire width apart. This first instance is further described herein with reference to FIGS. 7A through 7G and FIGS. 9A and 9B.

In a second instance, a first signal wire geometry and a second signal wire geometry are spaced greater than twice a shielding wire pitch plus a shielding wire width apart, but less than twice a shielding wire pitch plus twice a shielding wire width apart. This second instance is further described herein with reference to FIGS. 8A through 8G and FIGS. 9A and 9B.

In a third instance, a first signal wire geometry and a second signal wire geometry are spaced greater than or equal to twice a shielding wire pitch plus twice a shielding wire width apart, but less than three times a shielding wire pitch plus twice a shielding wire width apart. This third instance is further described herein with reference to FIGS. 10A through 10I and FIGS. 11A and 11B.

In a fourth instance, a first signal wire geometry and a second signal wire geometry are spaced greater than three times a shielding wire pitch plus two times a shielding wire width. In this fourth instance, the signal wires are typically within a design rule spacing requirement and the generation of shielding wires is performed as earlier described with reference to FIGS. 3A through 3F and FIG. 4, which are herein incorporated by reference.

It can be appreciated by those of skill in the art that while only two adjacent signal wire geometries are illustrated in the following examples for clarity of description, the present invention can be applied to the entire signal wire topology of a metal layer, such as a plurality of adjacent signal wires in a signal wire bus. Further, although the formation of a shielding wire or shielding wires is illustrated with reference one side or another of a signal wire, a shielding wire can be generated using the present invention for both sides of a signal wire.

Additionally, for clarity of description of the present invention, the shielding wires generated to the outer sides of the first and second signal wires are illustrated without further consideration of adjacent signal wires that are not illustrated. Thus, although the outer shielding wires are described as having a resultant width in the example, it can be appreciated by those of skill in the art that the presence of other adjacent signal wires can result in a different width in accordance with the principles of the invention.

FIGS. 7A through 7G illustrate a method for topology based shielding wire generation as applied to adjacent first and second signal wires in which a first signal wire geometry and a second signal wire geometry are spaced twice a shielding wire pitch plus a shielding wire width apart according to one embodiment of the present invention. This embodiment of the present invention permits the generation of a single shielding wire between adjacent signal wires.

Figure 7B:
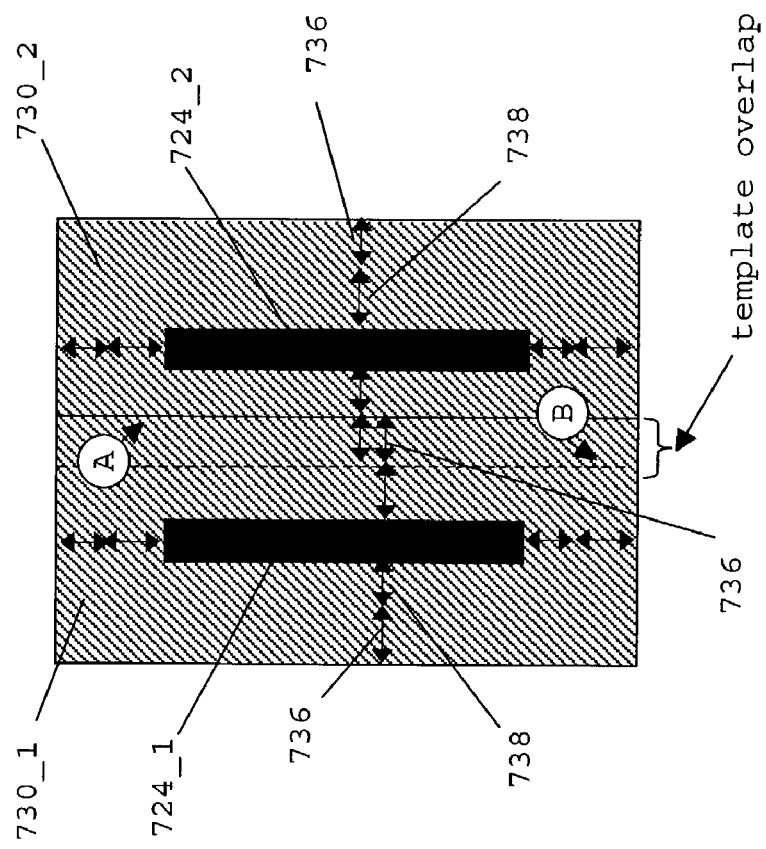
FIG. 7B illustrates sizing up of the first and second signal wire geometries of FIG. 7A to generate first and second templates according to one embodiment of the present invention.
Figure 7A:
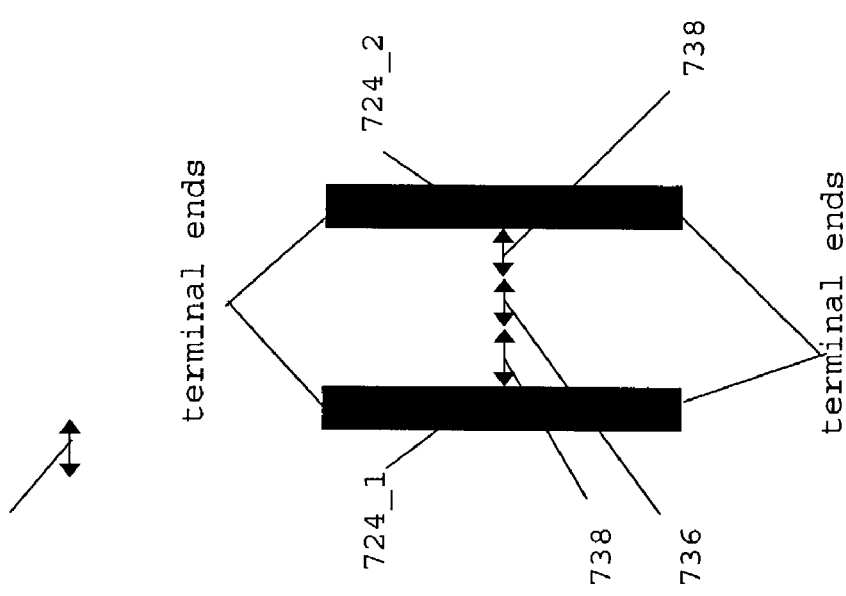
FIG. 7A illustrates adjacent first and second signal wire geometries according to one embodiment of the present invention.

FIG. 7A illustrates adjacent first and second signal wire geometries according to one embodiment of the present invention. In FIG. 7A, first signal wire geometry 724_1 has a first geometry with a resultant area. Second signal wire geometry 724_2 has a second geometry with a resultant area. The shortest edges of signal wire geometries 724_1 and 724_2 are termed the terminal ends. In this embodiment, first signal wire geometry 724_1 and second signal wire geometry 724_2 are spaced twice a shielding wire pitch 738 plus a shielding wire width 736 apart.

FIG. 7B illustrates sizing up of the first and second signal wire geometries of FIG. 7A to generate first and second templates according to one embodiment of the present invention. Once first and second signal wire geometries 724_1 and 724_2 are obtained, first template 730_1 and second template 730_2 are generated based upon each respective signal wire geometry. The generation of first and second templates 730_1 and 730_2 can be accomplished iteratively or simultaneously.

In this example, first signal wire geometry 724_1 is sized up a distance equal to a shielding wire width 736 plus a shielding wire pitch 738 to generate first template 730_1. First template 730_1 has a first geometry having a resultant first area.

Second signal wire geometry 724_2 is sized up a distance equal to a shielding wire width 736 plus a shielding wire pitch 738 to generate a second template 730_2. Second template 730_2 has a second geometry having a resultant second area. In this instance, first template 730_1 and 730_2 overlap in an area located between identifiers A and B which is a shielding wire width 736.

Figure 7D:
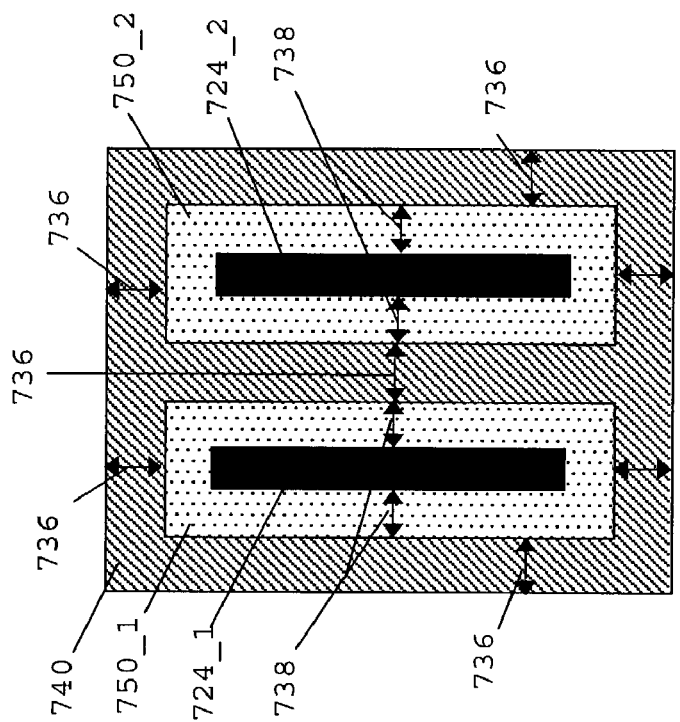
FIG. 7D illustrates sizing up of the first and second signal wire geometries to generate fourth and fifth templates according to one embodiment of the present invention.
Figure 7C:
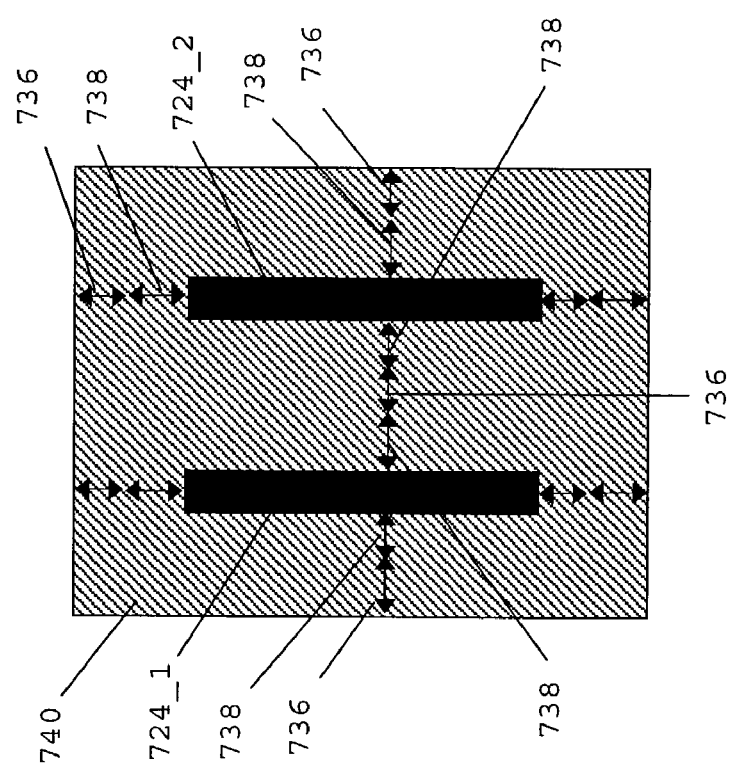
FIG. 7C illustrates merging of the first template and the second template with geometric subtraction of one of the template overlap areas shown in FIG. 7B to produce a combined third template according to one embodiment of the present invention.

FIG. 7C illustrates merging of the first template and the second template with geometric subtraction of one of the template overlap areas shown in FIG. 7B to produce a combined third template according to one embodiment of the present invention. In FIG. 7C, first template 730_1 and second template 730_2 are merged, e.g., geometrically added. In merging the templates, the template overlap created between identifiers A and B (FIG. 7B) results in a duplication of overlap areas having a shielding wire width 736. In the present illustration, the template overlap area located between identifiers A and B of either first template 730_1 or second template 730_2 is geometrically subtracted from the combined templates to produce a third template 740.

FIG. 7D illustrates sizing up of the first and second signal wire geometries to generate fourth and fifth templates according to one embodiment of the present invention. As illustrated, first signal wire geometry 724_1 is sized up a distance equal to a shielding wire pitch 738 to generate a fourth template 750_1. Iteratively or simultaneously, second signal wire geometry 724_2 is sized up a distance equal to a shielding wire pitch 738 to generate a fifth template 750_2.

Following generation of fourth template 750_1 and fifth template 750_2, a sixth template is generated by geometrically subtracting fourth template 750_1 and fifth template 750_2 from third template 740.

Figure 7F:
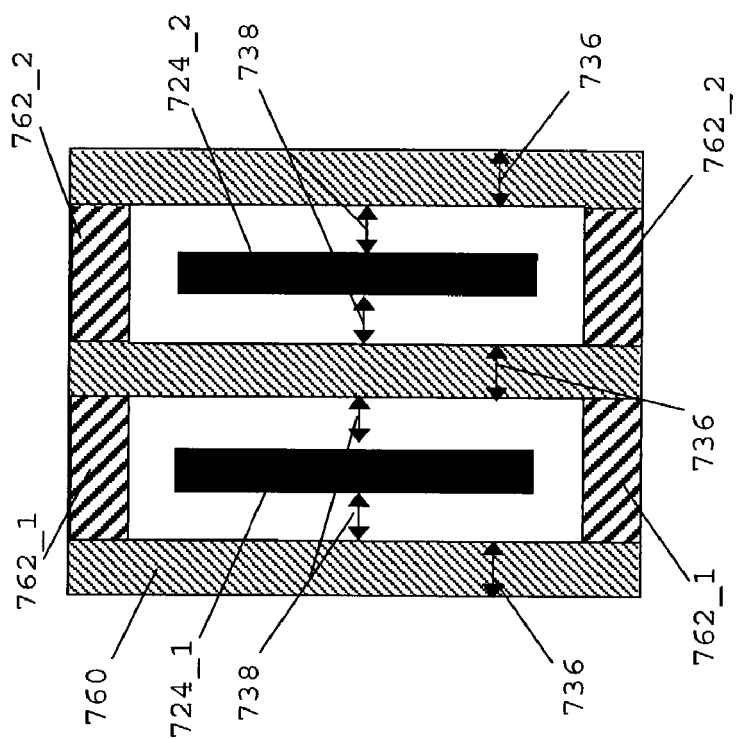
FIG. 7F illustrates sizing up of the terminal ends of the first and second signal wire geometries to generate one or more terminal areas of the sixth template according to one embodiment of the present invention.
Figure 7E:
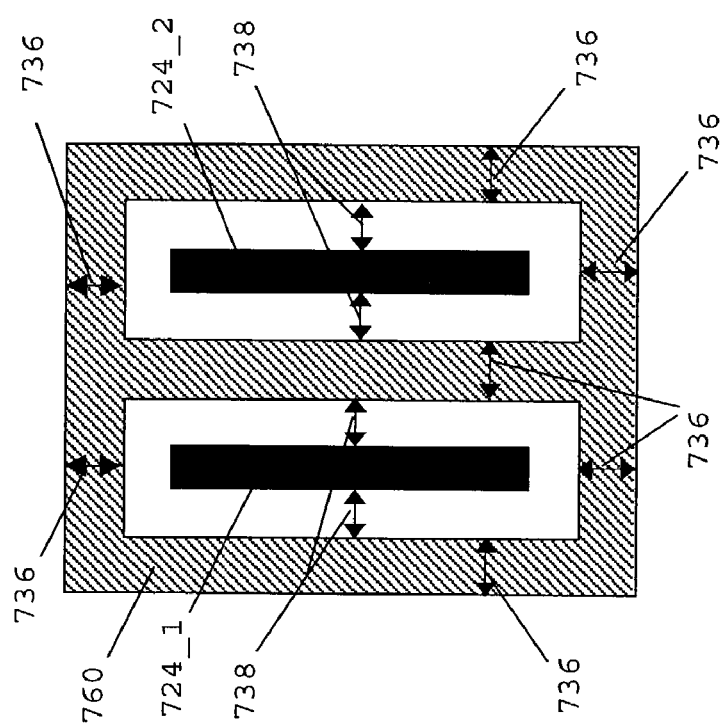
FIG. 7E illustrates geometric subtraction of the fourth and fifth templates from the third template resulting in a sixth template according to one embodiment of the present invention.

FIG. 7E illustrates geometric subtraction of the fourth and fifth templates from the third template resulting in a sixth template according to one embodiment of the present invention. As illustrated, geometric subtraction of fourth template 750_1 and fifth template 750_2 from third template 740 results in a sixth template 760. Sixth template 760 surrounds signal wire geometries 724_1 and 724_2 at an offset distance equal to a shielding wire pitch 738. As seen in FIG. 7E, the beginnings of shielding wire patterns having shielding wire width 736 are forming to each outer side of signal wire geometries 724_1 and 724_2, and between the adjacent signal wire geometries. Areas of sixth template 760 opposite the terminal ends of signal wire geometries 724_1 and 724_2 will next be removed.

FIG. 7F illustrates sizing up of the terminal ends of the first and second signal wire geometries to generate one or more terminal areas of the sixth template according to one embodiment of the present invention. In FIG. 7F, the terminal ends of first and second signal wire geometries 724_1 and 724_2 are sized up to the outer edges of the sixth template 760 opposite the terminal ends and to each side a signal wire pitch 738 to generate the terminal areas 762_1 and 762_2. Once the terminal areas 762_1 and 762_2 are generated, they are geometrically subtracted from the sixth template 760.

Figure 7G:
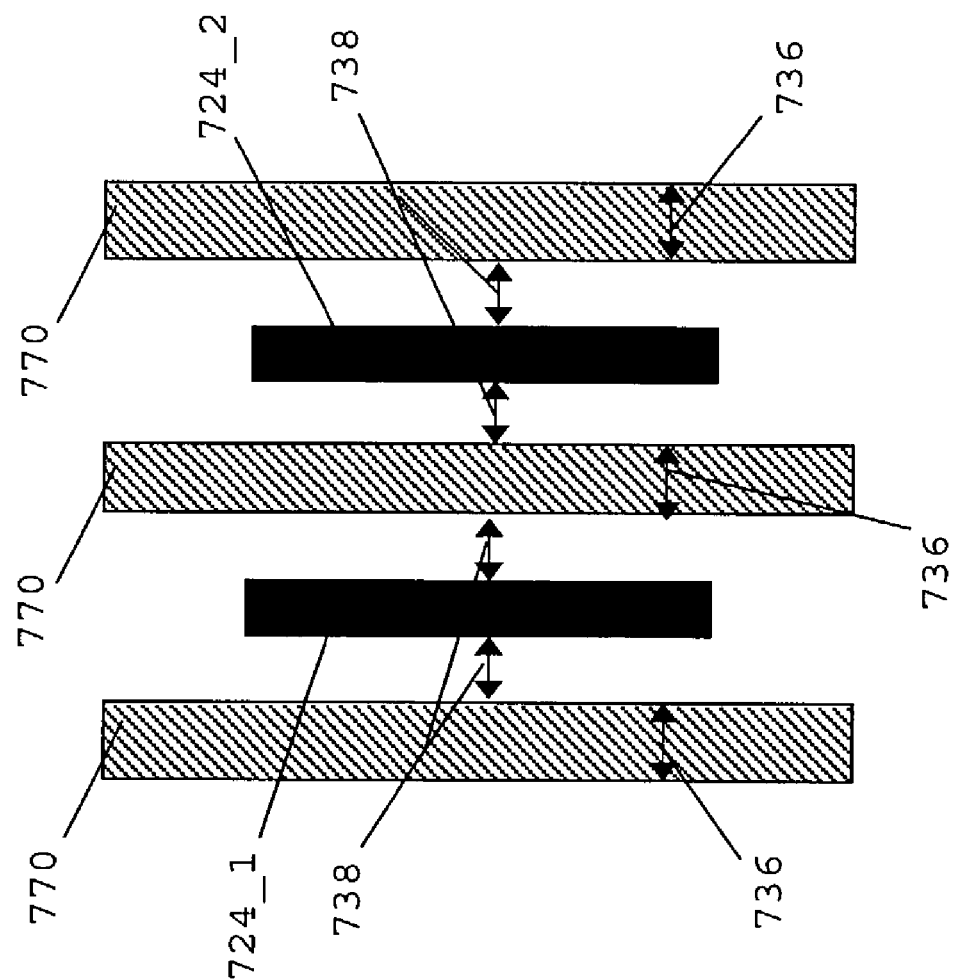
FIG. 7G illustrates geometric subtraction of the terminal areas from the sixth template to produce one or more shielding wire geometries according to one embodiment of the present invention.

FIG. 7G illustrates geometric subtraction of the terminal areas from the sixth template to produce one or more shielding wire geometries according to one embodiment of the present invention. In FIG. 7G, subtraction of terminal areas 762_1 and 762_2 from sixth template 760 (FIG. F) results in one or more shielding wire geometries 770, e.g., shielding wire patterns.

As illustrated in FIG. 7G, a single shielding wire geometry 770 having a shielding wire width 736 remains between first signal wire 724_1 and second signal wire 724_2. Thus, using the present invention shielding wire generation can be more efficiently accomplished by eliminating redundant shielding wires that violate design rules between adjacent signal wires.

FIGS. 8A through 8G illustrate a method for topology based shielding wire generation as applied to adjacent first and second signal wires in which a first signal wire and a second signal wire are spaced greater than twice a shielding wire pitch plus a shielding wire width apart, but less than twice a shielding wire pitch plus twice a shielding wire width apart. This embodiment of the present invention also permits the generation of a single shielding wire between the adjacent signal wires.

Figures 8A, 8B:
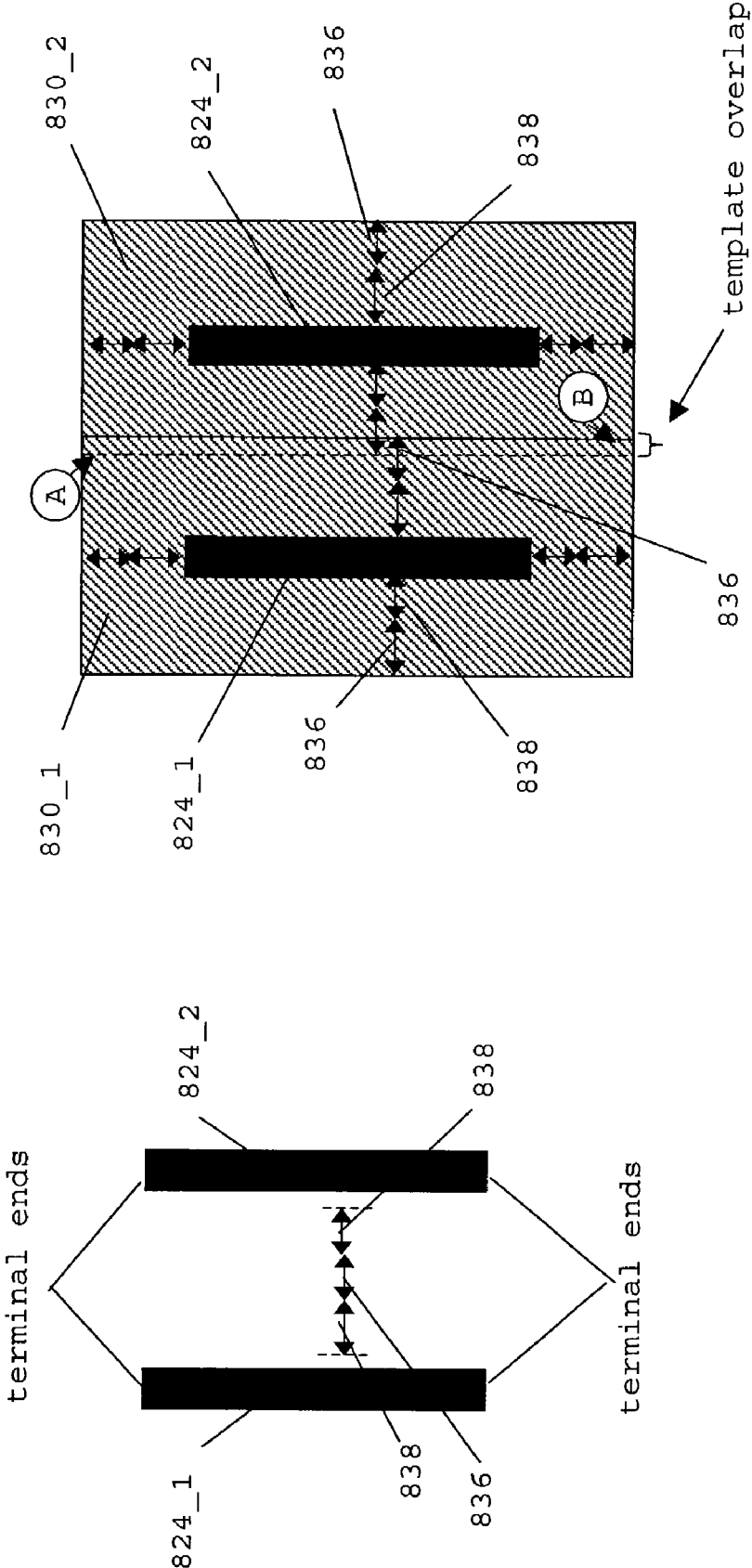
FIG. 8A illustrates adjacent first and second signal wire geometries according to one embodiment of the present invention.
FIG. 8B illustrates sizing up of the first and second signal wire geometries of FIG. 8A to generate first and second templates according to one embodiment of the present invention.

FIG. 8A illustrates adjacent first and second signal wire geometries according to one embodiment of the present invention. In FIG. 8A, first signal wire geometry 824_1 has a first geometry with a resultant area. Second signal wire geometry 824_2 has second geometry with a resultant area. The shortest edges of signal wire geometries 824_1 and 824_2 are termed the terminal ends. In this embodiment, first signal wire geometry 824_1 and second signal wire geometry 824_2 are spaced greater than twice a shielding wire pitch 838 plus a shielding wire width 836 apart, but less than twice a shielding wire pitch 838 plus twice a shielding wire width 836 apart.

FIG. 8B illustrates sizing up of the first and second signal wire geometries of FIG. 8A to generate first and second templates according to one embodiment of the present invention. Once first and second signal wire geometries 824_1 and 824_2 are obtained, first template 830_1 and second template 830_2 are generated based upon each respective signal wire geometry. The generation of first and second templates 830_1 and 830_2 can be accomplished iteratively or simultaneously.

In this example, first signal wire geometry 824_1 is sized up a distance equal to a shielding wire width 836 plus a shielding wire pitch 838 to generate first template 830_1. First template 830_1 has a first geometry having a resultant first area.

Second signal wire geometry 824_2 is sized up a distance equal to a shielding wire width 836 plus a shielding wire pitch 838 to generate a second template 830_2. Second template 830_2 has a second geometry having a resultant second area.

Thus, in this instance, first template 830_1 and 830_2 overlap in the area between indicators A and B that is less than a shielding wire width 836 apart.

Figure 8D:
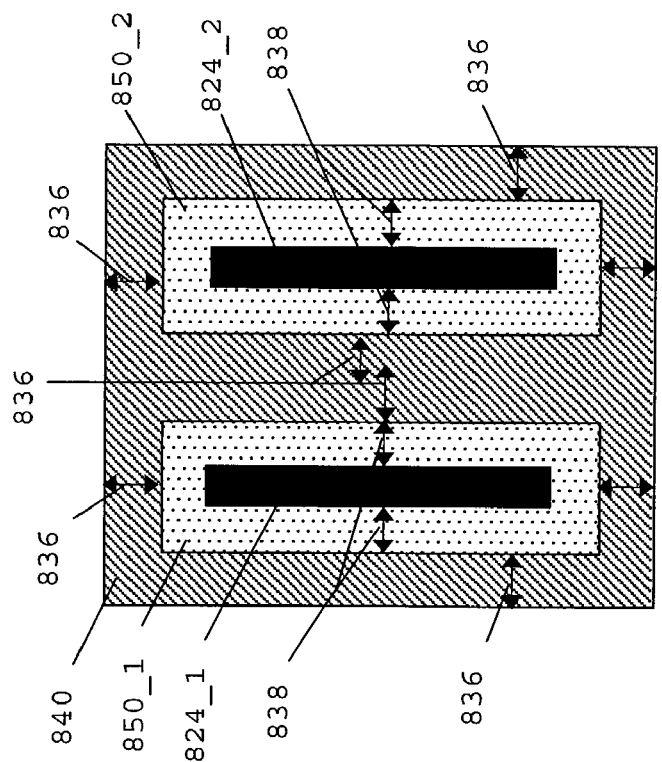
FIG. 8D illustrates sizing up of the first and second signal wire geometries to generate fourth and fifth templates according to one embodiment of the present invention.
Figure 8C:
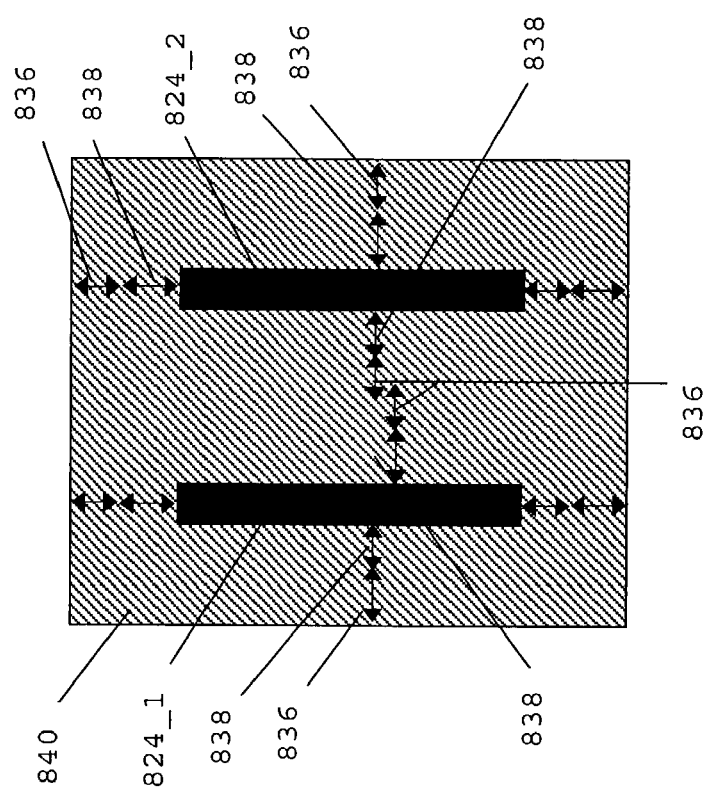
FIG. 8C illustrates merging of the first template and the second template with geometric subtraction of one of the template overlap areas shown in FIG. 8B to produce a combined third template according to one embodiment of the present invention.

FIG. 8C illustrates merging of the first template and the second template with geometric subtraction of one of the template overlap areas shown in FIG. 8B to produce a combined third template according to one embodiment of the present invention. In FIG. 8C, first template 830_1 and second template 830_2 are merged, e.g., geometrically added. In merging the templates, the template overlap created between identifiers A and B (FIG. 8B) results in a duplication of overlap areas having less than a shielding wire width 836. In the present illustration, the template overlap area located between identifiers A and B of either first template 830_1 or second template 830_2 is geometrically subtracted from the combined templates to produce a third template 840.

FIG. 8D illustrates sizing up of the first and second signal wire geometries to generate fourth and fifth templates according to one embodiment of the present invention. As illustrated, first signal wire geometry 824_1 is sized up a distance equal to a shielding wire pitch 838 to generate a fourth template 850_1. Iteratively or simultaneously, second signal wire geometry 824_2 is sized up a distance equal to a shielding wire pitch 838 to generate a fifth template 850_2.

Following generation of fourth template 850_1 and fifth template 850_2, a sixth template is generated by geometrically subtracting fourth template 850_1 and fifth template 850_2 from third template 840.

Figure 8F:
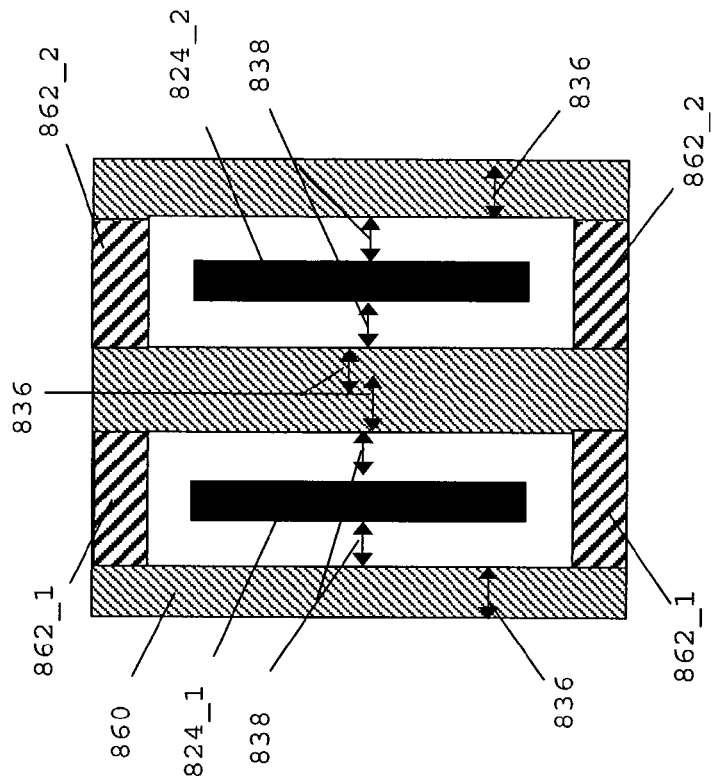
FIG. 8F illustrates sizing up of the terminal ends of the first and second signal wire geometries to generate one or more terminal areas of the sixth template according to one embodiment of the present invention.
Figure 8E:
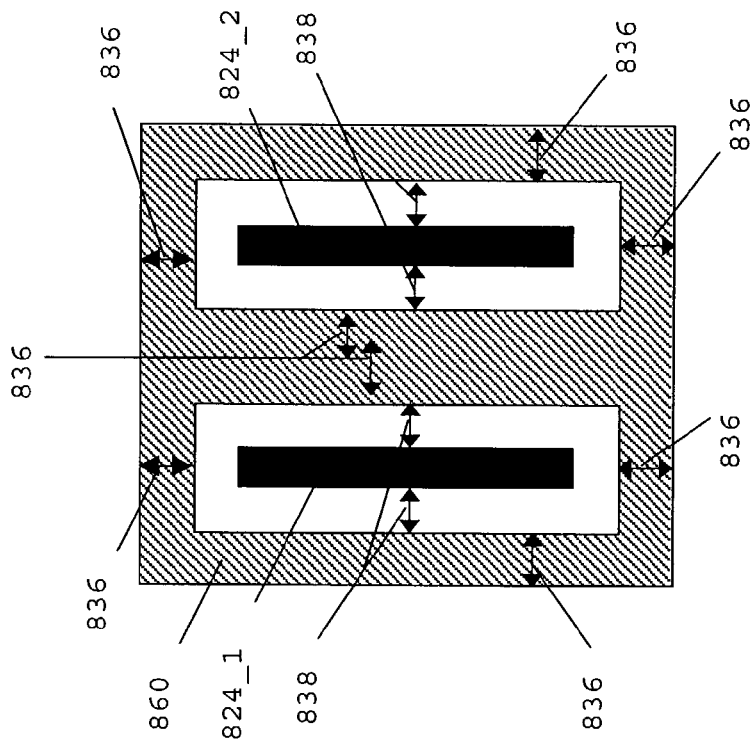
FIG. 8E illustrates geometric subtraction of the fourth and fifth templates from the third template resulting in a sixth template according to one embodiment of the present invention.

FIG. 8E illustrates geometric subtraction of the fourth and fifth templates from the third template resulting in a sixth template according to one embodiment of the present invention. As illustrated, geometric subtraction of fourth template 850_1 and fifth template 850_2 from third template 840 results in a sixth template 860. Sixth template 860 surrounds signal wire geometries 824_1 and 824_2 at an offset distance equal to a shielding wire pitch 838. As seen in FIG. 8E, the beginnings of shielding wire patterns having shielding wire width 836 are forming to each outer side of signal wire geometries 824_1 and 824_2. The beginnings of the shielding wire pattern between the adjacent signal wire geometries is greater than a shielding wire width 836. Areas of sixth template 860 opposite the terminal ends of signal wire geometries 824_1 and 824_2 will next be removed.

FIG. 8F illustrates sizing up of the terminal ends of the first and second signal wire geometries to generate one or more terminal areas of the sixth template according to one embodiment of the present invention. In FIG. 8F, the terminal ends of first and second signal wire geometries 824_1 and 824_2 are sized up to the outer edges of the sixth template 860 opposite the terminal ends and to each side a signal wire pitch 838 to generate the terminal areas 862_1 and 862_2. Once the terminal areas 862_1 and 862_2 are generated, they are geometrically subtracted from the sixth template 860.

FIG. 8G illustrates geometric subtraction of the terminal areas from the sixth template to produce one or more shielding wire geometries according to one embodiment of the present invention. In FIG. 8G, subtraction of terminal areas 862_1 and 862_2 from sixth template 860 (FIG. 8F) results in one or more shielding wire geometries 870, e.g., shielding wire patterns.

As illustrated in FIG. 8G, a single shielding wire geometry 870 having a width greater than a shielding wire width 836 remains between first signal wire 824_1 and second signal wire 824_2. Thus, using the present invention shielding wire generation that violates design rules can be avoided.

Figure 9A:
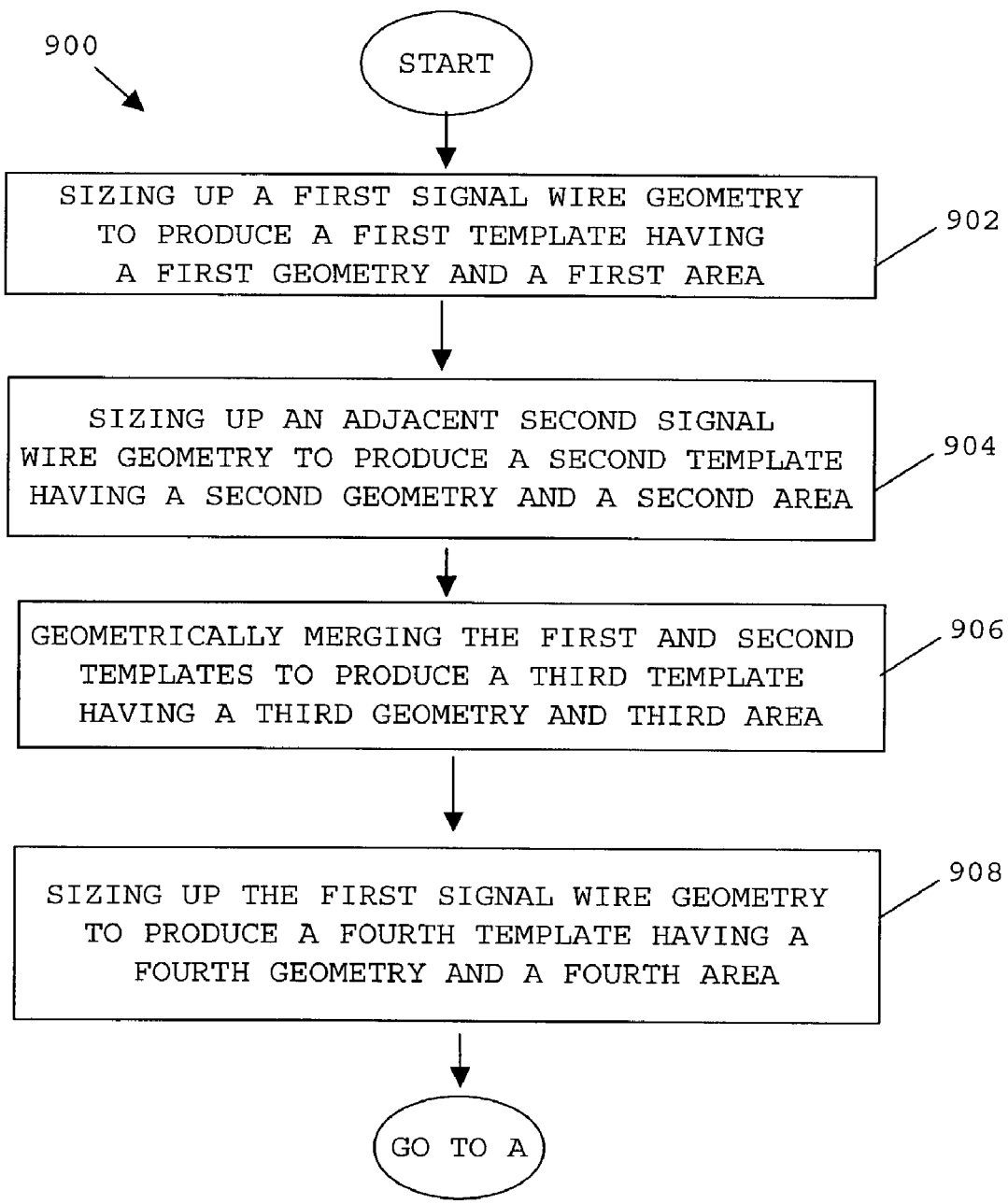
FIGS. 9A and 9B illustrate a process flow diagram of a method for topology based shielding wire generation described with reference to FIGS. 7A through 7G and FIGS. 8A through 8G according to one embodiment of the present invention.
Figure 9B:
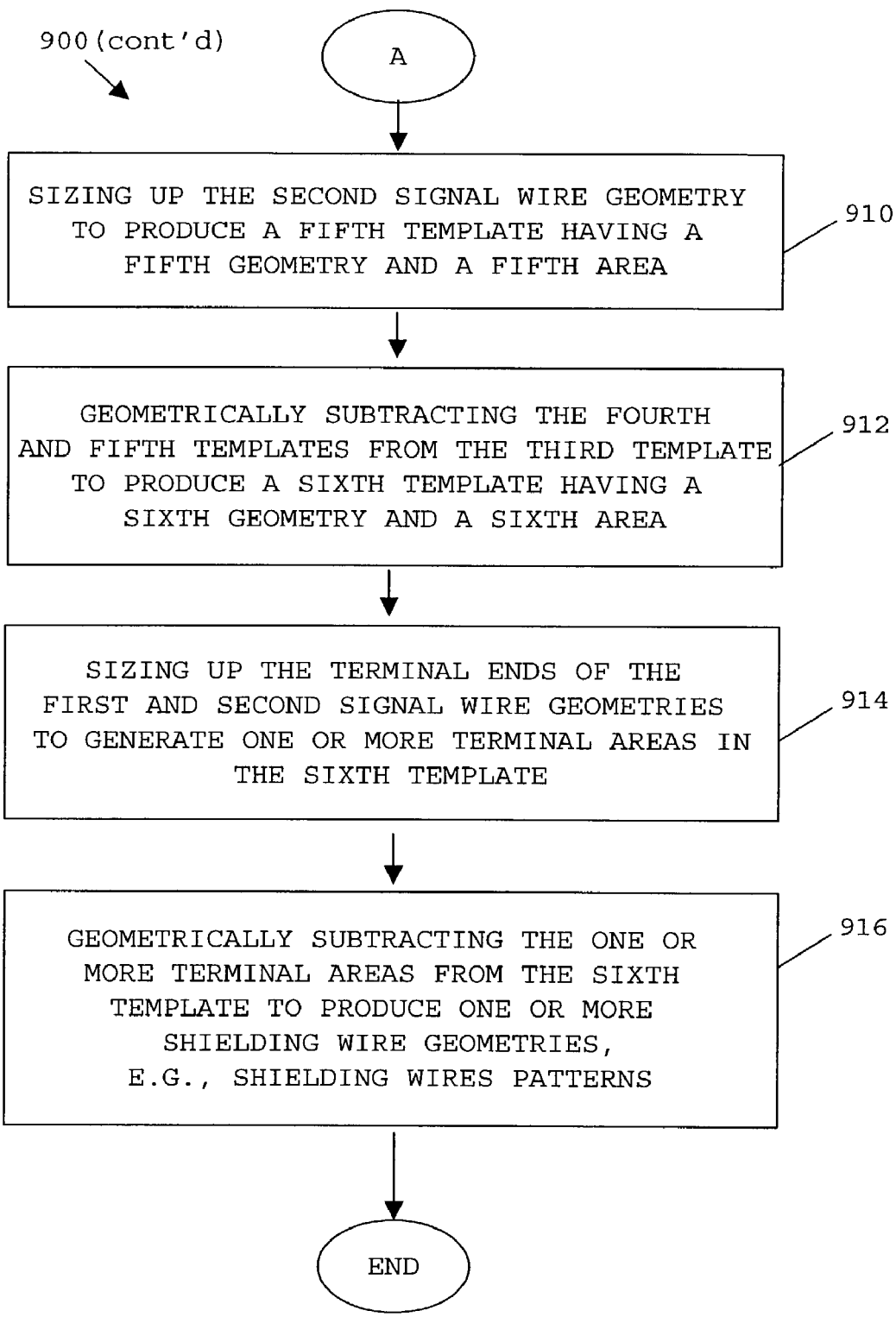

FIGS. 9A and 9B illustrate a process flow diagram of a method for topology based shielding wire generation described with reference to FIGS. 7A through 7G and FIGS. 8A through 8G according to one embodiment of the present invention. As seen in FIG. 9A, according to method 900, in operation 902, a first signal wire geometry is sized up to produce a first template having a first geometry and first area. For example, referring to FIG. 7A, signal wire geometry 724_1 is sized up a distance equal to a shielding wire pitch 738 plus a shielding wire width 736 to generate first template 730_1. Referring to FIG. 8A, signal wire geometry 824_1 is sized up a distance equal to a shielding wire pitch 838 plus a shielding wire width 836 to generate first template 830_1.

Returning to FIG. 9A, either iteratively or simultaneously with operation 902, in operation 904, an adjacent second signal wire geometry is sized up to produce a second template having a second geometry and a second area. The first and second templates creating a template overlap of duplicate overlap areas. For example, referring to FIG. 7A, signal wire geometry 724_2 is sized up a distance equal to a shielding wire pitch 738 plus a shielding wire width 736 to form second template 730_2. First template 730_1 and 730_2 create a template overlap of duplicate overlap areas between identifiers A and B. Referring to FIG. 8A, signal wire geometry 824_2 is sized up a distance equal to a shielding wire pitch 838 plus a shielding wire width 836 to form second template 830_2. First template 830_1 and 830_2 create a template overlap of duplicate overlap areas between identifiers A and B.

Returning to FIG. 9A, in operation 906, the first and second templates are geometrically merged, e.g., geometrically added and the overlap area of the first or second template is geometrically subtracted, to generate a third template having a third geometry and a third area. For example in FIG. 7C, the first template 730_1 and the second template 730_2 are geometrically, merged, e.g., geometrically added and the template overlap area of either first template 730_1 or second template 730_2 is geometrically subtracted from the combined template areas to generate a third template 740. Referring to FIG. 8C, the first template 830_1 and the second template 830_2 are geometrically merged, e.g., geometrically added and the template overlap area of either first template 830_1 or second template 830_2 is geometrically subtracted from the combined template areas, to generate a third template 840.

Returning to FIG. 9A, in operation 908, the first signal wire geometry is sized up to produce a fourth template. For example, referring to FIG. 7D, first signal wire geometry 724_1 is sized up a distance equal to a shielding wire pitch 738 to form a fourth template 750_1 having a fourth geometry and a fourth area. Referring to FIG. 8D, first signal wire geometry 824_1 is sized up a distance equal to a shielding wire pitch 838 to form a fourth template 850_1 having a fourth geometry and a fourth area.

Either iteratively or simultaneously with operation 908 (FIG. 9A), as shown in FIG. 9B, in operation 910, the second signal wire geometry is sized up to produce a fifth template. For example, referring to FIG. 7D, second signal wire geometry 724_2 is sized up a distance equal to a shielding wire pitch 738 to form a fifth template 750_2 having a fifth geometry and a fifth area. Note that the distance between the fourth template 750_1 and fifth template 750_2 is a shielding wire width 736. Referring to FIG. 8D, second signal wire geometry 824_2 is sized up a distance equal to a shielding wire pitch 838 to form a fifth template 850_2 having a fifth geometry and a fifth area. Note that the distance between the fourth template 850_1 and fifth template 850_2 is greater than a shielding wire width 836.

Returning to FIG. 9B, in operation 912, the fourth and fifth templates are geometrically subtracted from the third template to produce a remaining sixth template having a sixth geometry and a sixth area. For example, referring to FIG. 7E, fourth template 750_1 and fifth template 750_2 are geometrically subtracted from third template 740 leaving sixth template 760. Sixth template 760 surrounds first and second signal wire geometries 724_1 and 724_2 at an offset equal to shielding wire pitch 738 and having shielding wire width 736. Referring to FIG. 8E, fourth template 850_1 and fifth template 850_2 are geometrically subtracted from third template 840 leaving sixth template 860. Sixth template 860 surrounds first and second signal wire geometries 824_1 and 824_2 at an offset equal to shielding wire pitch 838 and having shielding wire width 836.

Returning to FIG. 9B, in operation 914, the terminal ends of the first and second signal wire geometries are sized up to generate one or more terminal areas in the sixth template. For example, referring to FIG. 7F, the terminal ends of signal wire geometries 724_1 and 724_2 are sized up to the outside edges of the sixth template 760 that are opposite the terminal ends and out as signal wire pitch 738 to each side. Referring to FIG. 8F, the terminal ends of signal wire geometries 824_1 and 824_2 are sized up to the outside edges of the sixth template 860 that are opposite the terminal ends and out as signal wire pitch 838 to each side.

Returning to FIG. 9B, in operation 916, the terminal areas are geometrically subtracted from the sixth template to generate one or more shielding wire geometries. For example, referring to FIG. 7G, subtraction of terminal areas 762_1 and 762_2 from sixth template 760, results in the generation of shielding wire geometries 770 having shielding wire width 736. Referring to FIG. 8G, subtraction of terminal areas 862_1 and 862_2 from sixth template 860, results in the generation of outer shielding wire geometries 870 having shielding wire width 836 while the interior shielding wire 870 located between the signal wires 824_1 and 824_2 has a width greater than a shielding wire width 836. As illustrated in FIGS. 7A through 7G and FIGS. 8A through 8G, generation of shielding wire patterns according to this embodiment of the present invention avoids duplicate shielding wire routings between adjacent signal wires.

FIGS. 10A through 10I illustrate a method for topology based shielding wire generation as applied to adjacent first and second signal wires in which the first signal wire and the second signal wire are spaced greater than or equal to twice a shielding wire pitch plus twice a shielding wire width apart, but less than three times a shielding wire pitch plus twice a shielding wire width apart. This embodiment of the present invention also permits the generation of a single shielding wire between the adjacent signal wires.

Figure 10B:
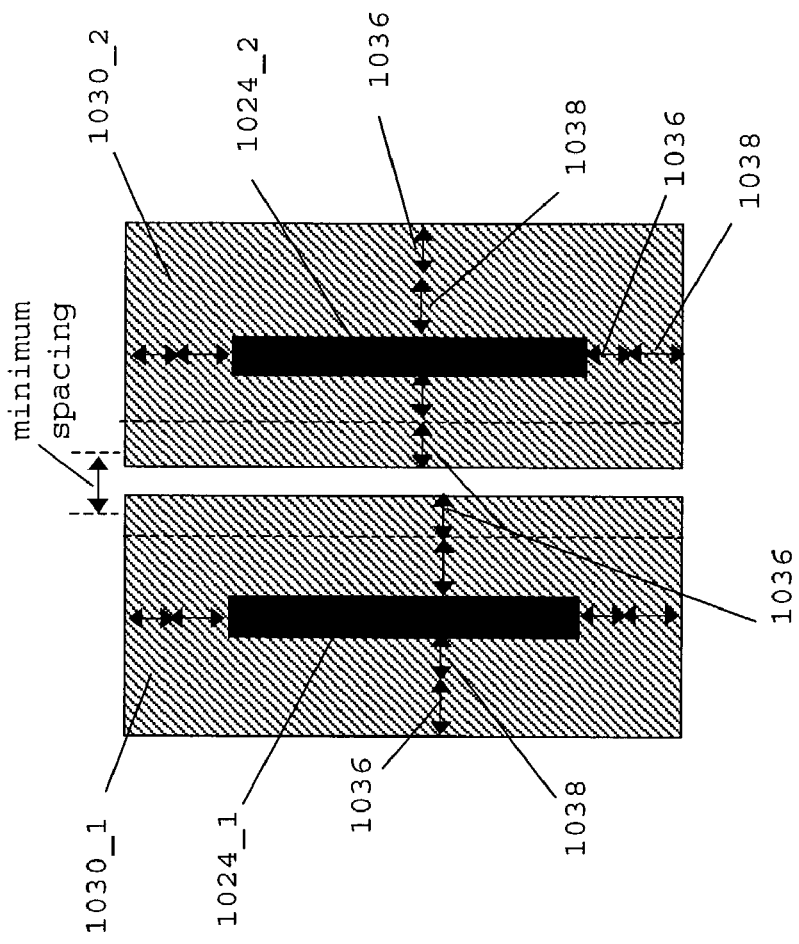
FIG. 10B illustrates sizing up of the first and second signal wire geometries of FIG. 10A to generate first and second templates according to one embodiment of the present invention.
Figure 10A:
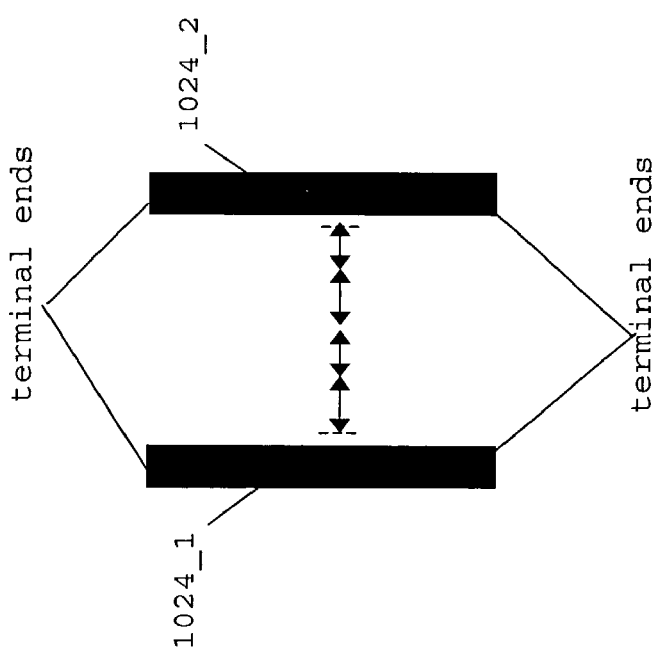
FIG. 10A illustrates adjacent first and second signal wire geometries according to one embodiment of the present invention.

FIG. 10A illustrates adjacent first and second signal wire geometries according to one embodiment of the present invention. In FIG. 10A, first signal wire 1024_1 has a first geometry with a resultant area. Second signal wire geometry 1024_2 has second geometry with a resultant area. The shortest edges of signal wire geometries 1024_1 and 1024_2 are termed the terminal ends. In this embodiment, first signal wire geometry 1024_1 and second signal wire geometry 1024_2 are spaced greater than twice a shielding wire pitch 1038 plus a shielding wire width 1036 apart, but less than twice a shielding wire pitch 1038 plus twice a shielding wire width 1036 apart.

FIG. 10B illustrates sizing up of the first and second signal wire geometries of FIG. 10A to generate first and second templates according to one embodiment of the present invention. Once first and second signal wire geometries 1024_1 and 1024_2 are obtained, first template 1030_1 and second template 1030_2 are generated based upon each respective signal wire geometry. The generation of the first and second templates 1030_1 and 1030_2 can be accomplished iteratively or simultaneously.

In this example, first signal wire geometry 1024_1 is sized up a distance equal to a shielding wire width 1036 plus a shielding wire pitch 1038 to generate first template 1030_1. First template 1030_1 has a first geometry having a resultant first area.

Second signal wire geometry 1024_2 is sized up a distance equal to a shielding wire width 1036 plus a shielding wire pitch 1038 to generate a second template 1030_2. Second template 1030_2 has a second geometry having a resultant second area. As illustrated in FIG. 10B, if first template 1030_1 and second template 1030_2 are not separated by a design rule minimum spacing, generation of separate, adjacent shielding wires can result in a design rule violation. Thus, in this instance, first template 1030_1 and second template 1030_2 are sized up again by one half of the design rule spacing to generate a template overlap.

FIG. 10C illustrates the sizing up of the first template and the second template to generate a template overlap according to one embodiment of the present invention. As illustrated, first template 1030_1 is sized up a pre-determined distance, D, such as one half a design rule spacing required between adjacent shielding wires, to generate third template 1040_1. Second template 1030_2 is sized up a pre-determined distance, D, such as one-half the design rule spacing required between adjacent shielding wires, to generate fourth template 1040_2. As illustrated, third template 1040_1 and fourth template 1040_2 create a template overlap with duplicate areas between indicators A and B.

FIG. 10D illustrates geometrically merging the third template and the fourth template to generate a fifth template according to one embodiment of the present invention. In FIG. 10D, third template 1040_1 and fourth template 1040_2 are merged, e.g., geometrically added. In merging the templates, the template overlap created between identifiers A and B (FIG. 10C) results in a duplication of overlap areas. In the present illustration, the template overlap area located between identifiers A and B of either third template 1040_1 or fourth template 1040_2 is geometrically subtracted from the combined templates to produce a fifth template 1050.

FIG. 10E illustrates sizing down of the fifth template to generate a sixth template according to one embodiment of the present invention. As illustrated, fifth template 1050 (FIG. 10D) is sized down by one-half the pre-determined distance, D, used in generating third template 1040_1 and fourth template 1040_2, to generate a sixth template 1060. For example, fifth template 1050 (FIG. 10D) can be sized down by one-half a design rule spacing required between adjacent shielding wires.

FIG. 10F illustrates sizing up of the first and second signal wire geometries to generate seventh and eighth templates according to one embodiment of the present invention. As illustrated, first signal wire geometry 1024_1 is sized up a distance equal to a shielding wire pitch 1038 to generate a seventh template 1070_1. Iteratively or simultaneously, second signal wire geometry 1024_2 is sized up a distance equal to a shielding wire pitch 1038 to generate an eighth template 1070_2.

Following generation of seventh template 1070_1 and eighth template 1070_2, a ninth template is generated by geometrically subtracting seventh template 1070_1 and eighth template 1070_2 from sixth template 1060.

FIG. 10G illustrates geometric subtraction of the seventh and eighth templates from the sixth template resulting in a ninth template according to one embodiment of the present invention. As illustrated, geometric subtraction of seventh template 1070_1 and eighth template 1070_2 from sixth template 1060 results in a ninth template 1080. Ninth template 1080 surrounds signal wire geometries 1024_1 and 1024_2 at an offset distance equal to a shielding wire pitch 1038. As seen in FIG. 10G, the beginnings of shielding wire patterns having shielding wire width 1036 are forming to each outer side of signal wire geometries 1024_1 and 1024_2. The beginnings of the shielding wire pattern between the adjacent signal wire geometries is greater than a shielding wire width 1036. Areas of ninth template 1080 opposite the terminal ends of the signal wire geometries 1024_1 and 1024_2 will next be removed.

FIG. 10H illustrates sizing up of the terminal ends of the first and second signal wire geometries to generate one or more terminal areas of the ninth template according to one embodiment of the present invention. In FIG. 10H, the terminal ends of the first and second signal wire geometries 1024_1 and 1024_2 are sized up to the outer edges of the ninth template 1080 opposite the terminal ends and to each side a signal wire pitch 1038 to generate the terminal areas 1062_1 and 1062_2. Once the terminal areas 1062_1 and 1062_2 are generated, they are geometrically subtracted from the ninth template 1080.

Figure 10I:
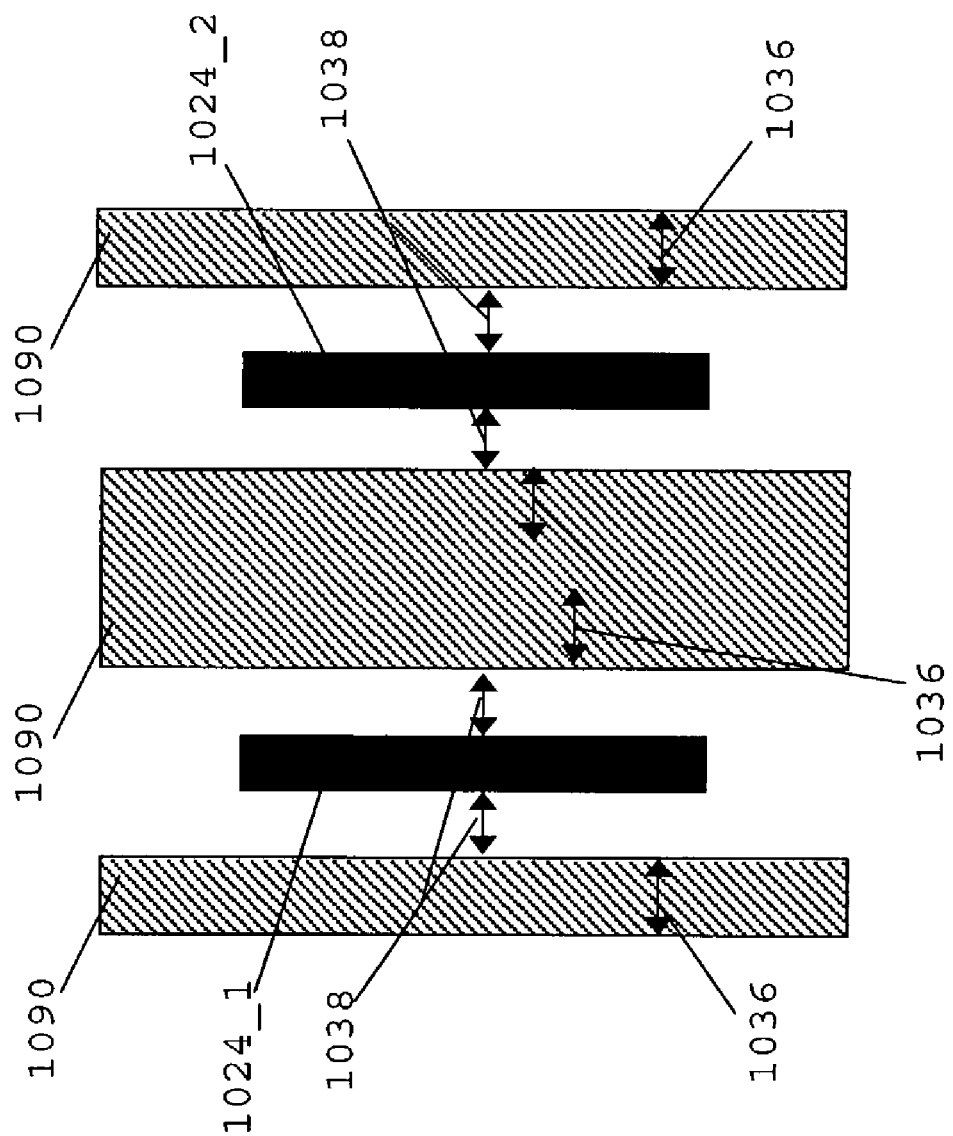
FIG. 10I illustrates geometric subtraction of the terminal areas from the ninth template to produce one or more shielding wire geometries according to one embodiment of the present invention.

FIG. 10I illustrates geometric subtraction of the terminal areas from the ninth template to produce one or more shielding wire geometries according to one embodiment of the present invention. In FIG. 10I, subtraction of terminal areas 1062_1 and 1062_2 from ninth template 1080 (FIG. 10H) results in one or more shielding wire geometries 1090, e.g., shielding wire patterns.

As illustrated in FIG. 10I, a single shielding wire geometry 1090 remains between first signal wire 1024_1 and second signal wire 1024_2. Thus, using the present invention duplicate shielding wire generation between adjacent signal wires that violate design rules can be avoided.

Figure 11A:
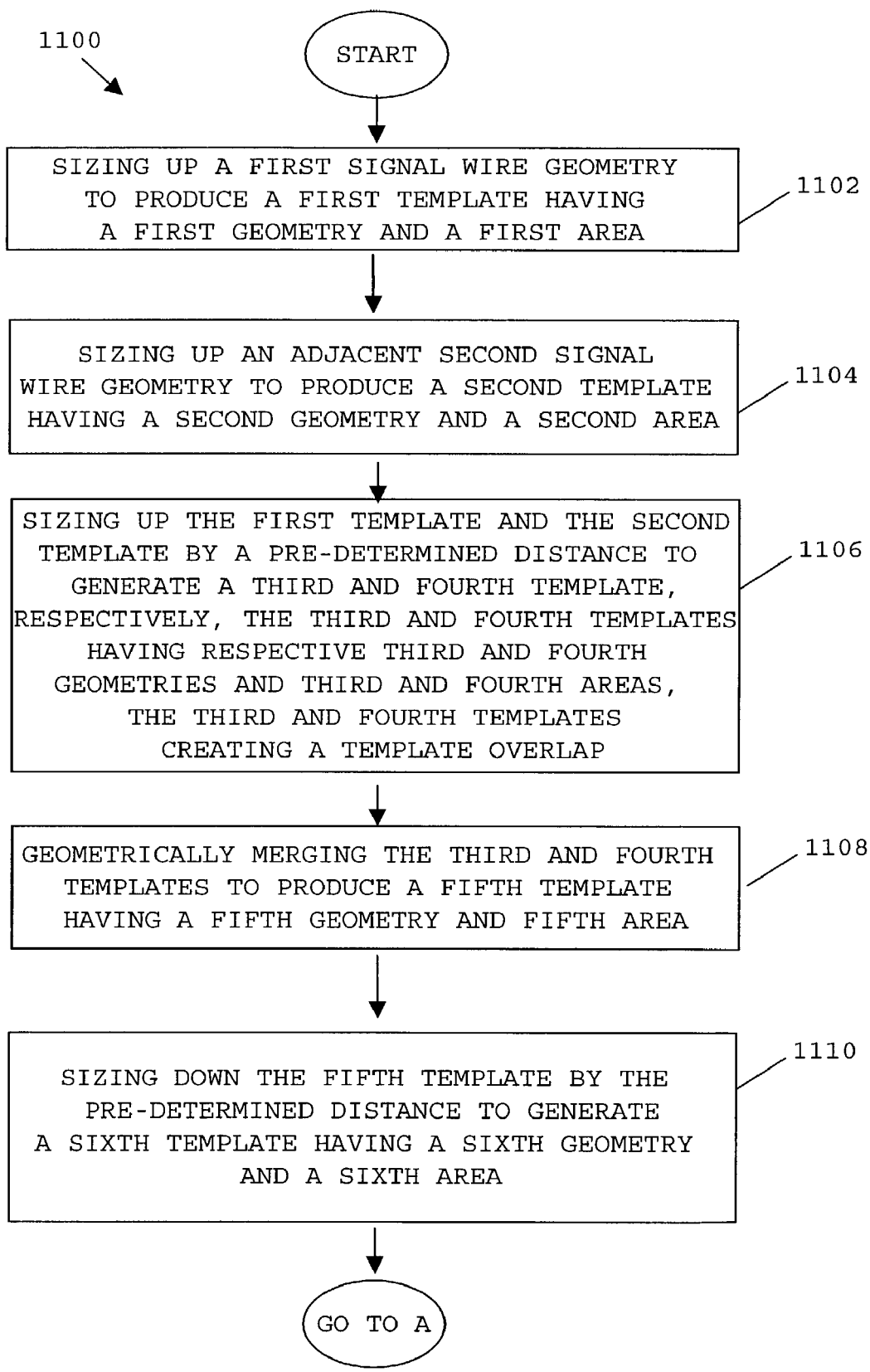
FIGS. 11A and 11B illustrate a process flow diagram of a method for topology based shielding wire generation described with reference to FIGS. 10A through 10I according to one embodiment of the present invention.
Figure 11B:
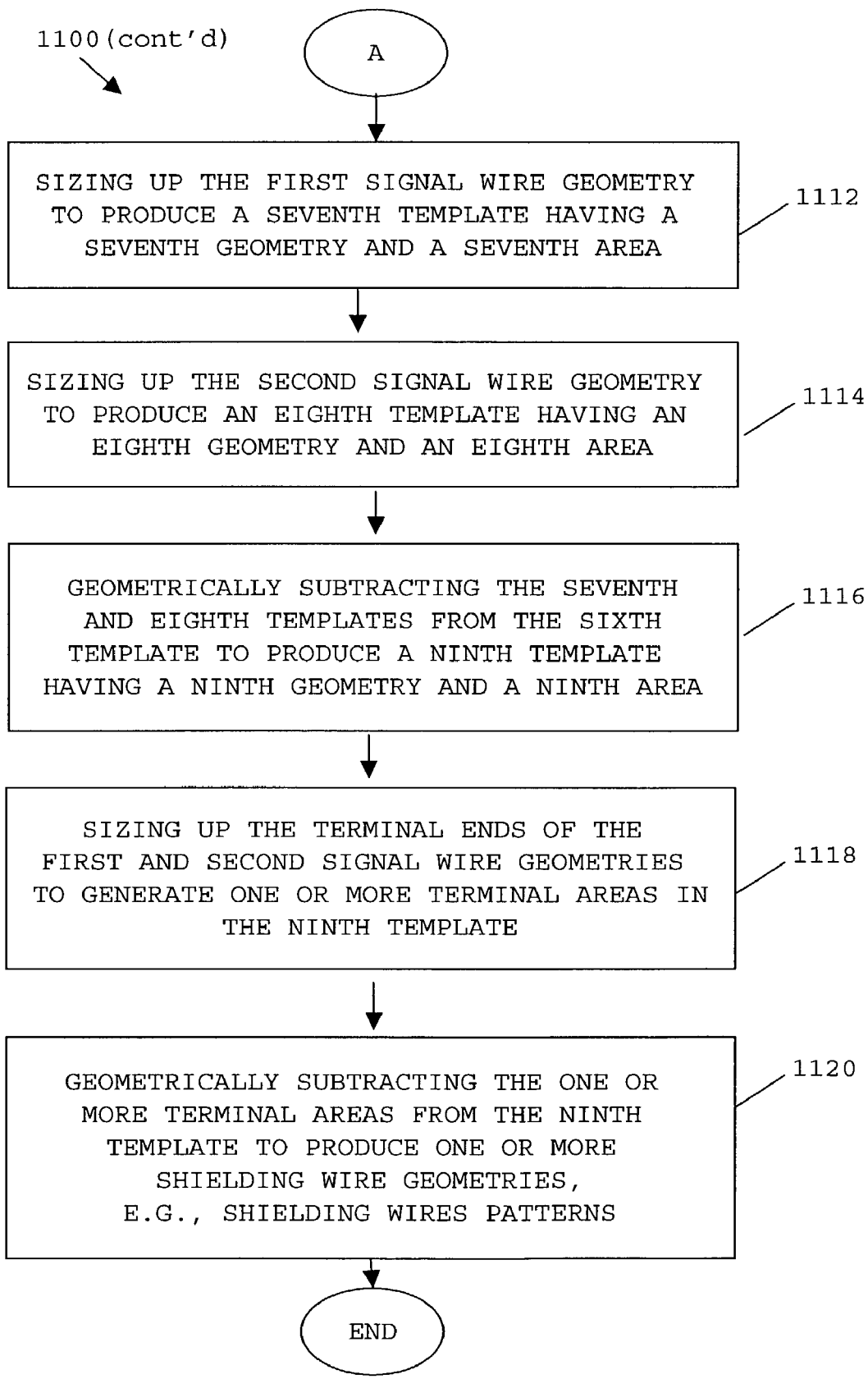

FIGS. 11A and 11B illustrate a process flow diagram of a method for topology based shielding wire generation described with reference to FIGS. 10A through 10I according to one embodiment of the present invention.

As seen in FIG. 11A, according to method 1100, in operation 1102, a first signal wire geometry is sized up to produce a first template having a first geometry and first area. For example, referring to FIG. 10A, signal wire geometry 1024_1 is sized up a distance equal to a shielding wire pitch 1038 plus a shielding wire width 1036 to generate first template 1030_1.

Returning to FIG. 11A, either iteratively or simultaneously with operation 1102, in operation 1104, an adjacent second signal wire geometry is sized up to produce a second template having a second geometry and a second area. For example, referring to FIG. 10A, signal wire geometry 1024_2 is sized up a distance equal to a shielding wire pitch 1038 plus a shielding wire width 1036 to form second template 1030_2.

As shown in FIG. 11A, in operation 1106, the first and second templates are sized up by a pre-determined distance, D to generate third and fourth templates which overlap. Referring to FIG. 10C, first template 1030_1 and second template 1030_2 (FIG. 10C) are sized up by one-half a pre-determined distance, D, such as one half a design rule spacing required between adjacent shielding wires, to generate third template 1050_1.

Returning to FIG. 11A, in operation 1108, the third and fourth templates are geometrically merged to generate a fifth template having a fifth geometry and a fifth area. For example, referring to FIG. 10D, the geometric addition of third template 1040_1 and fourth template 1040_2 results in a duplication of template overlap areas between identifiers A and B shown in FIG. 10C. Thus, the template overlap area of either third template 1040_1 or fourth template 1040_2 is geometrically subtracted from the combined template areas to generate fifth template 1050.

Returning to FIG. 11A, in operation 1110, the fifth template is sized down by the pre-determined distance used in generating the third and fourth templates to generate a sixth template having a sixth geometry and a sixth area. For example, referring to FIG. 10E, fifth template 1050 (FIG. 10D) is sized down by one-half the pre-determined distance, D, used in generating third template 1040_1 and fourth template 1040_2, to generate a sixth template 1060. For example, fifth template 1050 (FIG. 10D) can be sized down by one-half a design rule spacing required between adjacent shielding wires.

Returning to FIG. 11B, in operation 1112, the first signal wire geometry is sized up to produce a seventh geometry having a seventh area. Referring to FIG. 10F, first signal wire geometry 1024_1 is sized up a distance equal to a shielding wire pitch 1038 to form a seventh template 1070_1 having a seventh geometry and a seventh area.

Either iteratively or simultaneously with operation 1112 of FIG. 11B, in operation 1114, the second signal wire geometry is sized up to produce a eighth template. For example, referring to FIG. 10F, second signal wire geometry 1024_2 is sized up a distance equal to a shielding wire pitch 1038 to form an eighth template 1070_2 having a eighth geometry and an eighth area.

Returning to FIG. 11B, in operation 1116, the seventh and eighth templates are geometrically subtracted from the sixth template to produce a remaining ninth template having a ninth geometry and a ninth area. For example, referring to FIG. 10G, seventh template 1070_1 and eighth template 1070_2 (FIG. 10F) are geometrically subtracted from sixth template 1060 leaving ninth template 1080. Ninth template 1080 surrounds first and second signal wire geometries 1024_1 and 1024_2 at an offset equal to shielding wire pitch 1038.

Returning to FIG. 11B, in operation 1118, the terminal ends of the first and second signal wire geometries are sized up to generate one or more terminal areas in the ninth template. For example, referring to FIG. 10H, the terminal ends of signal wire geometries 1024_1 and 1024_2 are sized up to the outside edges of the ninth template 1080 that are opposite the terminal ends and a signal wire pitch 1038 to each side.

Returning to FIG. 11B, in operation 1120, the terminal areas are geometrically subtracted from the ninth template to generate one or more shielding wire geometries. For example, referring to FIG. 10I, subtraction of terminal areas 1062_1 and 1062_2 from ninth template 1080, results in generation of shielding wire geometries 1090. As illustrated in FIG. 10I, generation of shielding wire patterns in this manner avoids duplicate shielding wire routings between adjacent signal wires seen in the prior art.

The above-described embodiments can be implemented with DRC tools to assign power and ground nets. For example, using a connectivity aware DRC tool, such as DIVA or DRACULA, available from Cadence Design Systems, Inc. of San Jose, Calif., the present invention can be implemented to generate a shielding wire topology via over/under sizing in conjunction within Boolean layer operations, sometimes referred to as "knockout sizing". The design can then be split into tiles and the shielding wire topology is assigned to either the power or ground net alternately. Reducing net assignment to a local region will ensure that a small power to ground distribution gradient is achieved over the span of the chip.

The present invention advantageously can be implemented using existing CAD tools. Thus, a majority of tool maintenance falls upon the tool vendor, leaving mainly technical files and DRC code to be maintained by internal resources. Further, the topology based shielding wire generation of the present invention can faster than custom layout or conventionally utilized code, such as SKILL available from Cadence Design Systems, Inc. of San Jose, Calif.

A custom layout inherently requires a great deal of time and further more requires a designer to run DRC to ensure compliance to a design rule manual. Using a DRC tool not only incorporates the DRC checking into, and concurrent with, the topology generation, but it can also run faster as the CAD tools are written in native code and compiled for a particular platform, such as SPARC/Solaris available from Sun Microsystems, Inc. of Palo Alto, Calif. Custom code written in an interpretive language such as SKILL by definition, is not faster than native compiled code, and DRC checking must be done separately.

Any, all, or a portion of methods 400, 600, 900 and 1100 can be embodied as a computer program product comprising a medium configured to store or transport computer-readable instructions, such as program code, for methods 400, 600, 900 and 1100, or in which computer-readable instructions for methods 400, 600, 900 and 1100 are stored. Some examples of computer program products are CD-ROM discs, ROM cards, floppy discs, magnetic tapes, computer hard drives, servers on a network and signals transmitted over a network representing computer-readable instructions.

The foregoing descriptions of the present invention have been presented for purposes of illustration and description, and therefore are not exhaustive and do not limit the present invention to the precise form disclosed. Modifications and variations are possible in light of the above teachings or may be acquired from practicing the invention. For example, with reference to any particular order of template generating, it can be understood by those of skill in the art that other ordering as well as concurrent generation are within the scope of the present invention, e.g., a second template can be generated prior to or concurrent with a first template, etc.

Consequently, the scope of the invention is defined by the claims and their equivalents.

I claim:

1. A method for generating a shielding wire pattern comprising:
   obtaining a signal wire geometry, said signal wire geometry having terminal ends;
   sizing up said signal wire geometry to generate a first template having a first geometry and a first area;
   sizing up said signal wire geometry to generate a second template having a second geometry and a second area;
   geometrically subtracting said second template from said first template to generate a third template having a third geometry and a third area;
   sizing up said terminal ends of said signal wire geometry to generate one or more terminal areas of said third template, each of said terminal areas having a terminal geometry and terminal area; and
   geometrically subtracting said one or more terminal areas from said third template to generate one or more shielding wire patterns having a shielding wire geometry, wherein a shielding wire pattern represents a routing of a shielding wire used to maintain the electromagnetic integrity of a signal carried on a signal wire.

2. The method of claim 1, wherein in generating said first template, said signal wire geometry is sized up a distance equal to a shielding wire width plus a shielding wire pitch.

3. The method of claim 1, wherein in generating said second template, said signal wire geometry is sized up a distance equal to a shielding wire pitch.

4. The method of claim 1, wherein said method is implemented utilizing a computer assisted design (CAD) tool.

5. A method for generating a branched shielding wire pattern comprising:
   obtaining a branched signal wire geometry, said branched signal wire geometry having terminal ends;
   sizing up said branched signal wire geometry to generate a first template having a first geometry and a first area;
   sizing up said branched signal wire geometry to generate a second template having a second geometry and a second area;
   geometrically subtracting said second template from said first template to generate a third template having a third geometry and a third area;
   sizing up said terminal ends of said signal wire geometry to generate one or more terminal areas of said third template, each of said terminal areas having a terminal geometry and terminal area; and
   geometrically subtracting said one or more terminal areas from said third template to generate one or more shielding wire patterns having a shielding wire geometry, wherein a shielding wire pattern represents a routing of a shielding wire used to maintain the electromagnetic integrity of a signal carried on a signal wire.

6. The method of claim 5, wherein in generating said first template, said branched signal wire geometry is sized up a distance equal to a shielding wire width plus a shielding wire pitch.

7. The method of claim 5, wherein in generating said second template, said branched signal wire geometry is sized up a distance equal to a shielding wire pitch.

8. The method of claim 5, wherein said method is implemented utilizing a computer assisted design (CAD) tool.

9. A method for generating a shielding wire pattern comprising:
   obtaining a first signal wire geometry, said first signal wire geometry having first terminal ends;
   obtaining a second signal wire geometry, said second signal wire geometry being adjacent to said first signal wire geometry and having second terminal ends;
   geometrically sizing up said first signal wire geometry to generate a first template having a first geometry and a first area;
   geometrically sizing up said second signal wire geometry to generate a second template having a second geometry and a second area, said first template and said second template producing a template overlap of duplicate areas;
   geometrically merging said first template and said second template to generate a third template having a third geometry and a third area, wherein in geometrically merging said first template and said second template, said first template and said second template are geometrically added and one of said duplicate areas is geometrically subtracted;
   geometrically sizing up said first signal wire geometry to generate a fourth template having a fourth geometry and a fourth area;

geometrically sizing up said second signal wire geometry to generate a fifth template having a fifth geometry and a fifth area;

geometrically subtracting said fourth template and said fifth template from said third template to generate a sixth template having a sixth geometry and a sixth area;

sizing up said first and second terminal ends of said first and second signal wire geometries to generate one or more terminal areas of said sixth template, each of said terminal areas having a terminal geometry and terminal area; and geometrically subtracting said one or more terminal areas from said sixth template to generate one or more shielding wire patterns having a shielding wire geometry, wherein a shielding wire pattern represents a routing of a shielding wire used to maintain the electromagnetic integrity of a signal carried on a signal wire.

10. The method of claim 9, wherein in generating said first template, said first wire geometry is sized up a distance equal to a shielding wire width plus a shielding wire pitch.

11. The method of claim 9, wherein in generating said fourth template, said first wire geometry is sized up a distance equal to a shielding wire pitch.

12. The method of claim 9, wherein in generating said second template, said second wire geometry is sized up a distance equal to a shielding wire width plus a shielding wire pitch.

13. The method of claim 9, wherein in generating said fifth template, said second wire geometry is sized up a distance equal to a shielding wire pitch.

14. The method of claim 9, wherein said first and second templates are iteratively generated.

15. The method of claim 9, wherein said first and second templates are simultaneously generated.

16. The method of claim 9, wherein said fourth and fifth templates are iteratively generated.

17. The method of claim 9, wherein said fourth and fifth templates are simultaneously generated.

18. The method of claim 9, wherein said method is implemented utilizing a computer assisted design (CAD) tool.

19. A method for generating a shielding wire pattern comprising:

obtaining a first signal wire geometry, said first signal wire geometry having first terminal ends;

obtaining a second signal wire geometry, said second signal wire geometry being adjacent to said first signal wire geometry and having second terminal ends;

geometrically sizing up said first signal wire geometry to generate a first template having a first geometry and a first area;

geometrically sizing up said second signal wire geometry to generate a second template having a second geometry and a second area, said first template and said second template not producing a template overlap;

geometrically sizing up said first template by a pre-determined distance, D, to generate a third template having a third geometry and a third area;

geometrically sizing up said second template by the pre-determined distance, D, to generate a fourth template having a fourth geometry and a fourth area, said third and fourth templates producing a template overlap of duplicate areas;

geometrically merging said third template and said fourth template to generate a fifth template having a fifth geometry and a fifth area, wherein in geometrically merging said third template and said fourth template, said third template and said fourth template are geometrically added and one of said duplicate areas is geometrically subtracted;

geometrically sizing down said fifth template to generate a sixth template having a sixth geometry and a sixth area;

geometrically sizing up said first signal wire geometry to generate a seventh template having a seventh geometry and a seventh area;

geometrically sizing up said second signal wire geometry to generate an eighth template having an eighth geometry and an eighth area;

geometrically subtracting said seventh template and said eighth template from said sixth template to generate a ninth template having a ninth geometry and a ninth area;

sizing up said first and second terminal ends of said first and second signal wire geometries to generate one or more terminal areas of said ninth template, each of said terminal areas having a terminal geometry and terminal area; and geometrically subtracting said one or more terminal areas from said ninth template to generate one or more shielding wire patterns having a shielding wire geometry, wherein a shielding wire pattern represents a routing of a shielding wire used to maintain the electromagnetic integrity of a signal carried on a signal wire.

20. The method of claim 19, wherein in generating said first template said first signal wire geometry is sized up a distance equal to a shielding wire width plus a shielding wire pitch.

21. The method of claim 19, wherein in generating said second template said second signal wire geometry is sized up a distance equal to a shielding wire width plus a shielding wire pitch.

22. The method of claim 19, wherein in generating said third template said first template is sized up said pre-determined distance, D, equal to one-half a design rule spacing requirement.

23. The method of claim 19, wherein in generating said fourth template said second template is sized up a pre-determined distance, D, equal to one-half a design rule spacing requirement.

24. The method of claim 19, wherein in generating said seventh template said first signal wire geometry is sized up a distance equal to a shielding wire pitch.

25. The method of claim 19, wherein in generating said eighth template said second signal wire geometry is sized up a distance equal to a shielding wire pitch.

26. The method of claim 19, wherein said fifth template is sized down by said pre-determined distance, D, equal to one-half a design rule spacing requirement.

27. The method of claim 19, wherein said first and second templates are simultaneously generated.

28. The method of claim 19, wherein said first and second templates are iteratively generated.

29. The method of claim 19, wherein said seventh and eighth templates are simultaneously generated.

30. The method of claim 19, wherein said seventh and eighth templates are iteratively generated.

31. The method of claim 19, wherein said method is implemented utilizing a computer assisted design (CAD) tool.

32. A computer program product having stored thereon computer readable instructions wherein execution of the computer readable instructions generates a method for generating a shielding wire pattern, said method comprising:
- obtaining a signal wire geometry, said signal wire geometry having terminal ends;
- sizing up said signal wire geometry to generate a first template having a first geometry and a first area;
- sizing up said signal wire geometry to generate a second template having a second geometry and a second area;
- geometrically subtracting said second template from said first template to generate a third template having a third geometry and a third area;
- sizing up said terminal ends of said signal wire geometry to generate one or more terminal areas of said third template, each of said terminal areas having a terminal geometry and terminal area; and
- geometrically subtracting said one or more terminal areas from said third template to generate one or more shielding wire patterns having a shielding wire geometry, wherein a shielding wire pattern represents a routing of a shielding wire used to maintain the electromagnetic integrity of a signal carried on a signal wire.

33. The computer program product of claim 32, wherein in generating said first template, said first signal wire geometry is sized up a distance equal to a shielding wire width plus a shielding wire pitch.

34. The computer program product of claim 32, wherein in generating said second template, said first wire geometry is sized up a distance equal to a shielding wire pitch.

35. The computer program product of claim 32, wherein said method is implemented utilizing a computer assisted design (CAD) tool.

36. A computer program product having stored thereon computer readable instructions wherein execution of the computer readable instructions generates a method for generating a branched shielding wire pattern, said method comprising:
- obtaining a branched signal wire geometry, said branched signal wire geometry having terminal ends;
- sizing up said branched signal wire geometry to generate a first template having a first geometry and a first area;
- sizing up said branched signal wire geometry to generate a second template having a second geometry and a second area;
- geometrically subtracting said second template from said first template to generate a third template having a third geometry and a third area;
- sizing up said terminal ends of said signal wire geometry to generate one or more terminal areas of said third template, each of said terminal areas having a terminal geometry and terminal area; and
- geometrically subtracting said one or more terminal areas from said third template to generate one or more shielding wire patterns having a shielding wire geometry, wherein a shielding wire pattern represents a routing of a shielding wire used to maintain the electromagnetic integrity of a signal carried on a signal wire.

37. The computer program product of claim 36, wherein in generating said first template, said branched signal wire geometry is sized up a distance equal to a shielding wire width plus a shielding wire pitch.

38. The computer program product of claim 36, wherein in generating said second template, said branched signal wire geometry is sized up a distance equal to a shielding wire pitch.

39. The computer program product of claim 36, wherein said method is implemented utilizing a computer assisted design (CAD) tool.

40. A computer program product having stored thereon computer readable instructions wherein execution of the computer readable instructions generates a method for generating a shielding wire pattern, said method comprising:
- obtaining a first signal wire geometry, said first signal wire geometry having first terminal ends;
- obtaining a second signal wire geometry, said second signal wire geometry being adjacent to said first signal wire geometry and having second terminal ends;
- geometrically sizing up said first signal wire geometry to generate a first template having a first geometry and a first area;
- geometrically sizing up said second signal wire geometry to generate a second template having a second geometry and a second area, said first template and said second template producing a template overlap of duplicate areas;
- geometrically merging said first template and said second template to generate a third template having a third geometry and a third area, wherein in geometrically merging said first template and said second template, said first template and said second template are geometrically added and one of said duplicate areas is geometrically subtracted;
- geometrically sizing up said first signal wire geometry to generate a fourth template having a fourth geometry and a fourth area;
- geometrically sizing up said second signal wire geometry to generate a fifth template having a fifth geometry and a fifth area;
- geometrically subtracting said fourth template and said fifth template from said third template to generate a sixth template having a sixth geometry and a sixth area;
- sizing up said first and second terminal ends of said first and second signal wire geometries to generate one or more terminal areas of said sixth template, each of said terminal areas having a terminal geometry and terminal area; and
- geometrically subtracting said one or more terminal areas from said sixth template to generate one or more shielding wire patterns having a shielding wire geometry, wherein a shielding wire pattern represents a routing of a shielding wire used to maintain the electromagnetic integrity of a signal carried on a signal wire.

41. The computer program product of claim 40, wherein in generating said first template, said first wire geometry is sized up a distance equal to a shielding wire width plus a shielding wire pitch.

42. The computer program product of claim 40, wherein in generating said fourth template, said first wire geometry is sized up a distance equal to a shielding wire pitch.

43. The computer program product of claim 40, wherein in generating said second template, said second wire geometry is sized up a distance equal to a shielding wire width plus a shielding wire pitch.

44. The computer program product of claim 40, wherein in generating said fifth template, said second wire geometry is sized up a distance equal to a shielding wire pitch.

45. The computer program product of claim 40, wherein said first and second templates are iteratively generated.

46. The computer program product of claim 40, wherein said first and second templates are simultaneously generated.

47. The computer program product of claim 40, wherein said fourth and fifth templates are iteratively generated.

48. The computer program product of claim 40, wherein said fourth and fifth templates are simultaneously generated.

49. The computer program product of claim 40, wherein said method is implemented utilizing a computer assisted design (CAD) tool.

50. A computer program product having stored thereon computer readable instructions wherein execution of the computer readable instructions generates a method for generating a shielding wire pattern, said method comprising:
    obtaining a first signal wire geometry, said first signal wire geometry having first terminal ends;
    obtaining a second signal wire geometry, said second signal wire geometry being adjacent to said first signal wire geometry and having second terminal ends;
    geometrically sizing up said first signal wire geometry to generate a first template having a first geometry and a first area;
    geometrically sizing up said second signal wire geometry to generate a second template having a second geometry and a second area, said first template and said second template not producing a template overlap;
    geometrically sizing up said first template by a pre-determined distance, D, to generate a third template having a third geometry and a third area;
    geometrically sizing up said second template by the pre-determined distance, D, to generate a fourth template having a fourth geometry and a fourth area, said third and fourth templates producing a template overlap of duplicate areas;
    geometrically merging said third template and said fourth template to generate a fifth template having a fifth geometry and a fifth area, wherein in geometrically merging said third template and said fourth template, said third template and said fourth template are geometrically added and one of said duplicate areas is geometrically subtracted;
    geometrically sizing down said fifth template to generate a sixth template having a sixth geometry and a sixth area;
    geometrically sizing up said first signal wire geometry to generate a seventh template having a seventh geometry and a seventh area;
    geometrically sizing up said second signal wire geometry to generate an eighth template having an eighth geometry and an eighth area;
    geometrically subtracting said seventh template and said eighth template from said sixth template to generate a ninth template having a ninth geometry and a ninth area;
    sizing up said first and second terminal ends of said first and second signal wire geometries to generate one or more terminal areas of said ninth template, each of said terminal areas having a terminal geometry and terminal area; and
    geometrically subtracting said one or more terminal areas from said ninth template to generate one or more shielding wire patterns having a shielding wire geometry, wherein a shielding wire pattern represents a routing of a shielding wire used to maintain the electromagnetic integrity of a signal carried on a signal wire.

51. The computer program product of claim 50, wherein in generating said first template said first signal wire geometry is sized up a distance equal to a shielding wire width plus a shielding wire pitch.

52. The computer program product of claim 50, wherein in generating said second template said second signal wire geometry is sized up a distance equal to a shielding wire width plus a shielding wire pitch.

53. The computer program product of claim 50, wherein in generating said third template said first template is sized up said pre-determined distance, D, equal to one-half a design rule spacing requirement.

54. The computer program product of claim 50, wherein in generating said fourth template said second template is sized up a pre-determined distance, D, equal to one-half a design rule spacing requirement.

55. The computer program product of claim 50, wherein in generating said seventh template said first signal wire geometry is sized up a distance equal to a shielding wire pitch.

56. The computer program product of claim 50, wherein in generating said eighth template said second signal wire geometry is sized up a distance equal to a shielding wire pitch.

57. The computer program product of claim 50, wherein said fifth template is sized down by said pre-determined distance, D, equal to one-half a design rule spacing requirement.

58. The computer program product of claim 50, wherein said first and second templates are simultaneously generated.

59. The computer program product of claim 50, wherein said first and second templates are iteratively generated.

60. The computer program product of claim 50, wherein said seventh and eighth templates are simultaneously generated.

61. The computer program product of claim 50, wherein said seventh and eighth templates are iteratively generated.

62. The computer program product of claim 50, wherein said method is implemented utilizing a computer assisted design (CAD) tool.

* * * * *

UNITED STATES PATENT AND TRADEMARK OFFICE
CERTIFICATE OF CORRECTION

PATENT NO. : 7,003,750 B2  Page 1 of 1
APPLICATION NO. : 10/211495
DATED : February 21, 2006
INVENTOR(S) : Thomas N. Valine It is certified that error appears in the above-identified patent and that said Letters Patent is hereby corrected as shown below:

Column 25
In Claim 19, at line 60, change "the" to read --said--.

Column 26
In Claim 23, at line 43, change "a" to read --said--.
In Claim 32, at line 67, change "the" to read --said--.

Column 27
In Claim 36, at line 34, change "the" to read --said--.

Column 28
In Claim 40, at line 5, change "the" to read --said--.

Column 29
In Claim 50, at line 9, change "the" to read --said--.
In Claim 50, at line 27, change "the" to read --said--.

Column 30
In Claim 54, at line 25, after "up", change "a" to read --said--.

Signed and Sealed this

First Day of August, 2006

JON W. DUDAS
*Director of the United States Patent and Trademark Office*

UNITED STATES PATENT AND TRADEMARK OFFICE
CERTIFICATE OF CORRECTION

PATENT NO.        : 7,003,750 B2  
APPLICATION NO. : 10/211495  
DATED             : February 21, 2006  
INVENTOR(S)       : Thomas N. Valine It is certified that error appears in the above-identified patent and that said Letters Patent is hereby corrected as shown below:

Column 25  
In Claim 19, at line 60, change "the" to read --said--.

Column 26  
In Claim 23, at line 43, change "a" to read --said--.  
In Claim 32, at line 67, change "the" to read --said--

Column 27  
In Claim 36, at line 34, change "the" to read --said--.

Column 28  
In Claim 40, at line 5, change "the" to read --said--.

Column 29  
In Claim 50, at line 9, change "the" to read --said--  
In Claim 50, at line 27, change "the" to read --said--.

Column 30  
In Claim 54, at line 25, after "up", change "a" to read --said--.

Signed and Sealed this

Twenty-second Day of August, 2006

JON W. DUDAS  
*Director of the United States Patent and Trademark Office*